(12) United States Patent
Chang et al.

(10) Patent No.: US 12,419,099 B2
(45) Date of Patent: Sep. 16, 2025

(54) METHOD FOR MANUFACTURING SEMICONDUCTOR DEVICE

(71) Applicant: TAIWAN SEMICONDUCTOR MANUFACTURING COMPANY, LTD., Hsinchu (TW)

(72) Inventors: Wei-Ting Chang, Hsinchu (TW); Kuo-Ju Chen, Taichung (TW); Tien-Shun Chang, New Taipei (TW); Su-Hao Liu, Chiayi County (TW); Huicheng Chang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 622 days.

(21) Appl. No.: 17/887,320

(22) Filed: Aug. 12, 2022

(65) Prior Publication Data
US 2024/0055300 A1 Feb. 15, 2024

(51) Int. Cl.
*H10D 84/03* (2025.01)
*H10D 64/01* (2025.01)
*H10D 84/01* (2025.01)

(52) U.S. Cl.
CPC ......... *H10D 84/038* (2025.01); *H10D 64/017* (2025.01); *H10D 84/0158* (2025.01)

(58) Field of Classification Search
CPC .. H10D 84/0158; H10D 30/024; H10D 30/43; H10D 30/014; H10D 30/6735; H10D 64/017; H01L 21/027; H01L 21/0273; H01L 21/0332; H01L 21/0334
See application file for complete search history.

(56) References Cited

U.S. PATENT DOCUMENTS

| | | | |
|---|---|---|---|
| 2017/0005195 A1* | 1/2017 | Ching | H10D 62/115 |
| 2022/0216050 A1* | 7/2022 | Yu | H01L 21/02274 |

* cited by examiner

*Primary Examiner* — Tuan A Hoang
(74) *Attorney, Agent, or Firm* — Maschoff Brennan

(57) ABSTRACT

A method includes forming a fin structure over a substrate; depositing a dummy gate layer over the substrate and the fin structure; depositing a hard mask stack over the dummy gate layer; depositing a photoresist bottom layer over the hard mask stack, wherein the photoresist bottom layer has a first stress; performing an implantation process to the photoresist bottom layer to form an implanted bottom layer with a second stress closer to 0 than the first stress; patterning the implanted bottom layer; patterning the hard mask stack and the dummy gate layer by using the patterned implanted bottom layer as an etch mask to form a dummy gate structure over the fin structure; and replacing the dummy gate structure with a metal gate structure.

20 Claims, 43 Drawing Sheets

METHOD FOR MANUFACTURING SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
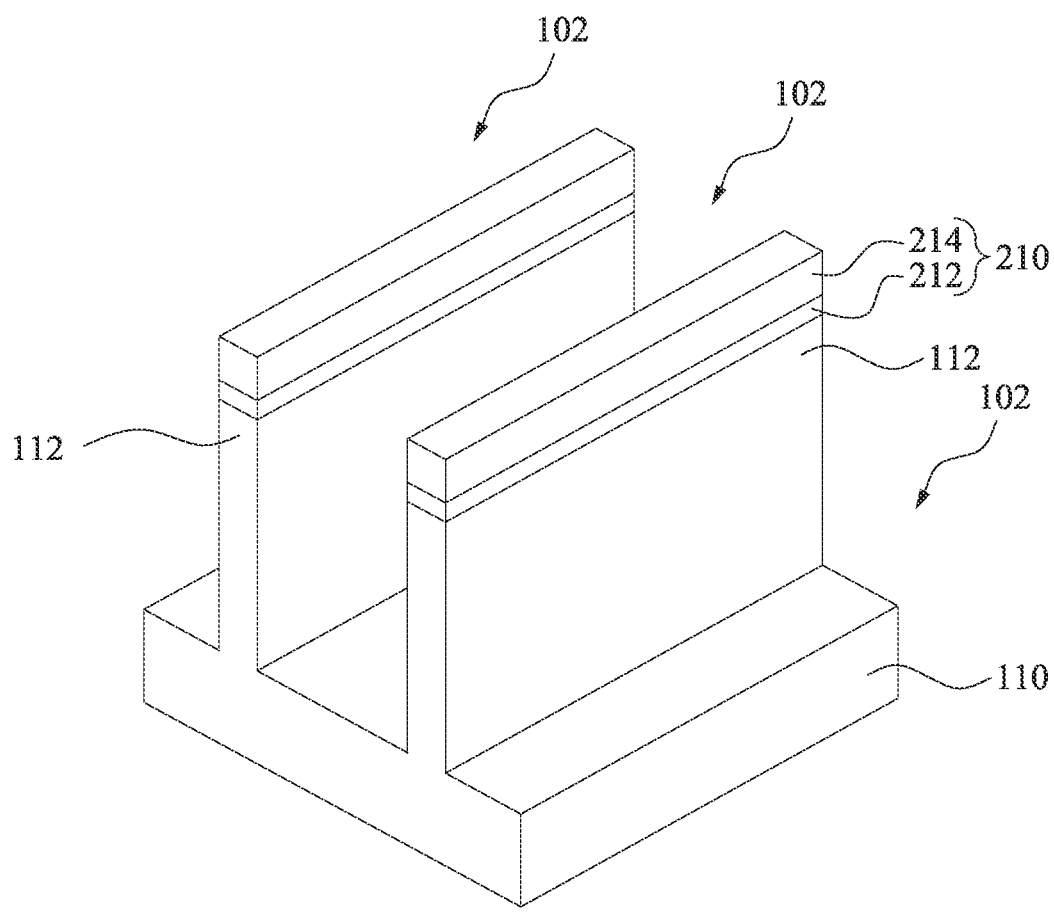
FIGS. 1-14 illustrate a method for manufacturing the semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The present disclosure is related to semiconductor devices and methods of forming the same. More particularly, some embodiments of the present disclosure are related to methods for improving the distortion of gates by implanting a hard mask formed over a dummy gate material prior to patterning the dummy gate material into dummy gates of the semiconductor devices.

FIGS. 1-14 illustrate a method for manufacturing the semiconductor device at various stages in accordance with some embodiments of the present disclosure. In addition to the semiconductor device, FIGS. 1-14 depict X-axis, Y-axis, and Z-axis directions. In some embodiments, the semiconductor device shown in FIGS. 1-14 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110 is provided. In some embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure.

One or more semiconductor fins 112 are formed on the substrate 110. The semiconductor fins 112 can be equivalently referred to as fin structures in some embodiments. The semiconductor fins 112 may be N-type or P-type. For example, one or some of the semiconductor fins 112 are N-type, and one or some of the semiconductor fins 112 are P-type. The semiconductor fins 112 may be formed using, for example, a patterning process to form trenches such that trenches are formed between adjacent semiconductor fins 112. As discussed in greater detail below, the semiconductor fins 112 will be used to form FinFETs. It is understood that two semiconductor fins 112 are illustrated for purposes of illustration, but other embodiments may include any number of semiconductor fins. In some embodiments, one or more dummy semiconductor fins are formed adjacent to the semiconductor fins 112.

The semiconductor fins 112 may be formed by performing an etching process to the substrate 110. Specifically, a patterned hard mask structure 210 is formed over the substrate 110. In some embodiments, the patterned hard mask structure 210 is formed of silicon nitride, silicon oxynitride, silicon carbide, silicon carbon-nitride, or the like. For example, the patterned hard mask structure 210 includes an oxide pad layer 212 and a nitride mask layer 214 over the oxide pad layer 212. The patterned hard mask structure 210 covers a portion of the substrate 110 while leaves another portion of the substrate 110 uncovered. The substrate 110 is then patterned using the patterned hard mask structure 210 as a mask to form trenches 102. Accordingly, the semiconductor fins 112 are formed.

Figure 3:
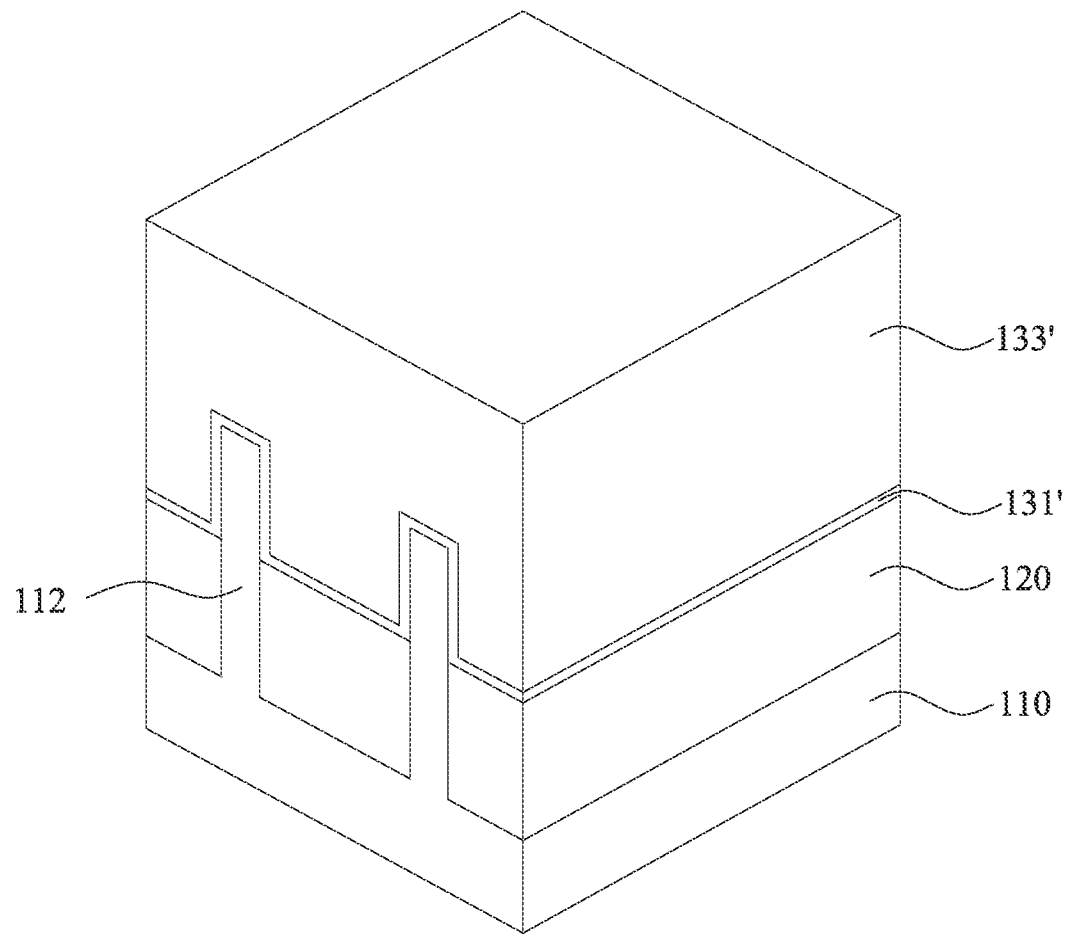

Reference is made to FIG. 3. Isolation structures 120, such as shallow trench isolations (STI), are disposed in trenches 102 (see FIG. 1) and over the substrate 110. The isolation structures 120 can be equivalently referred to as an isolation insulating layer in some embodiments. The isolation structures 120 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 120 are formed through a process such as CVD, flowable CVD (FCVD), or a spin-on-glass process, although any acceptable process may be utilized. Subsequently, portions of the isolation structures 120 extending over the top surfaces of the semiconductor fins 112, are removed using, for example, an etching back process, chemical mechanical polishing (CMP), or the like.

Figure 2:
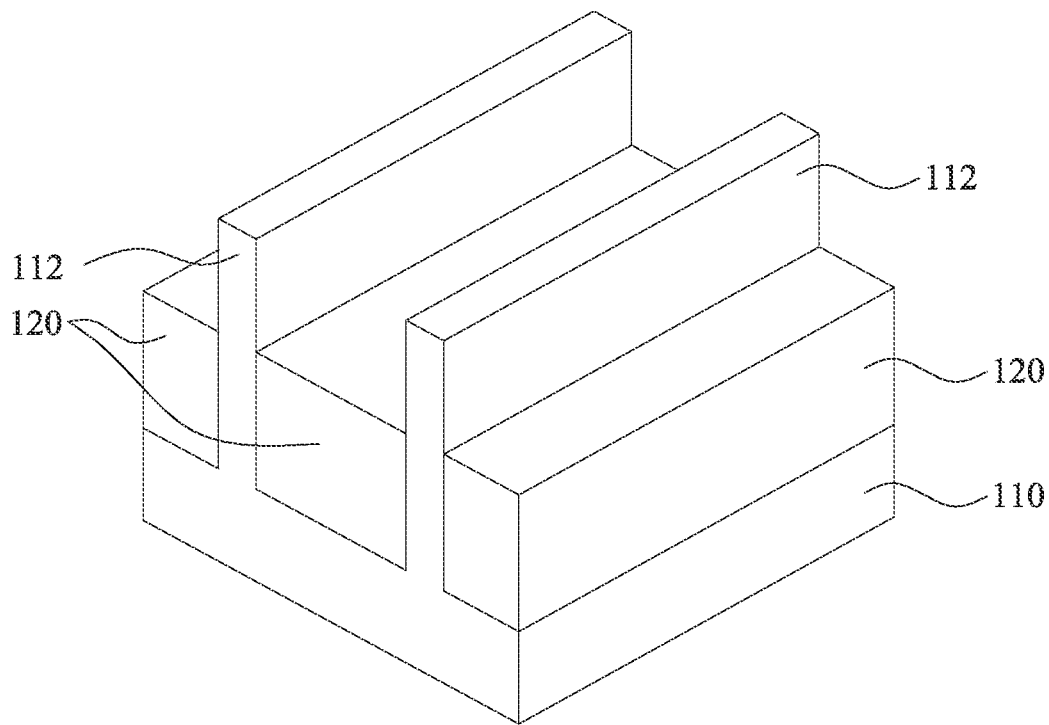
Figure 2:
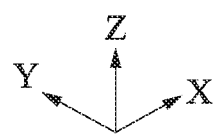

The isolation structures 120 are then recessed to expose upper portions of the semiconductor fins 112 as illustrated in FIG. 2. In some embodiments, the isolation structures 120 are recessed using a single etch processes, or multiple etch processes. In some embodiments in which the isolation structures 120 is made of silicon oxide, the etch process may be, for example, a dry etch, a chemical etch, or a wet cleaning process. For example, the chemical etch may employ fluorine-containing chemical such as dilute hydrofluoric (dHF) acid.

Reference is made to FIG. 3. A dummy dielectric layer 131' is formed over the substrate 110 and covering the semiconductor fins 112. The dummy dielectric layer 131' may be, for example, silicon oxide, silicon nitride, combinations thereof, or the like, and may be deposited or thermally grown according to acceptable techniques. A dummy gate layer 133' is then formed over the dummy dielectric layer 131'. The dummy gate layer 133' may be deposited over the dummy dielectric layer 131' and then planarized, such as by a CMP. The dummy gate layer 133' may include polycrystalline-silicon (poly-Si) or polycrystalline silicon-germanium (poly-SiGe). In some embodiments, after the CMP process, an etching process is performed to remove a top portion of the dummy gate layer 133' such that the height of the dummy gate layer 133' is reduced. In some embodiments, the etching process may be one or more dry etching process(es), one or more wet etching process(es), or combinations thereof.

Figure 4A:
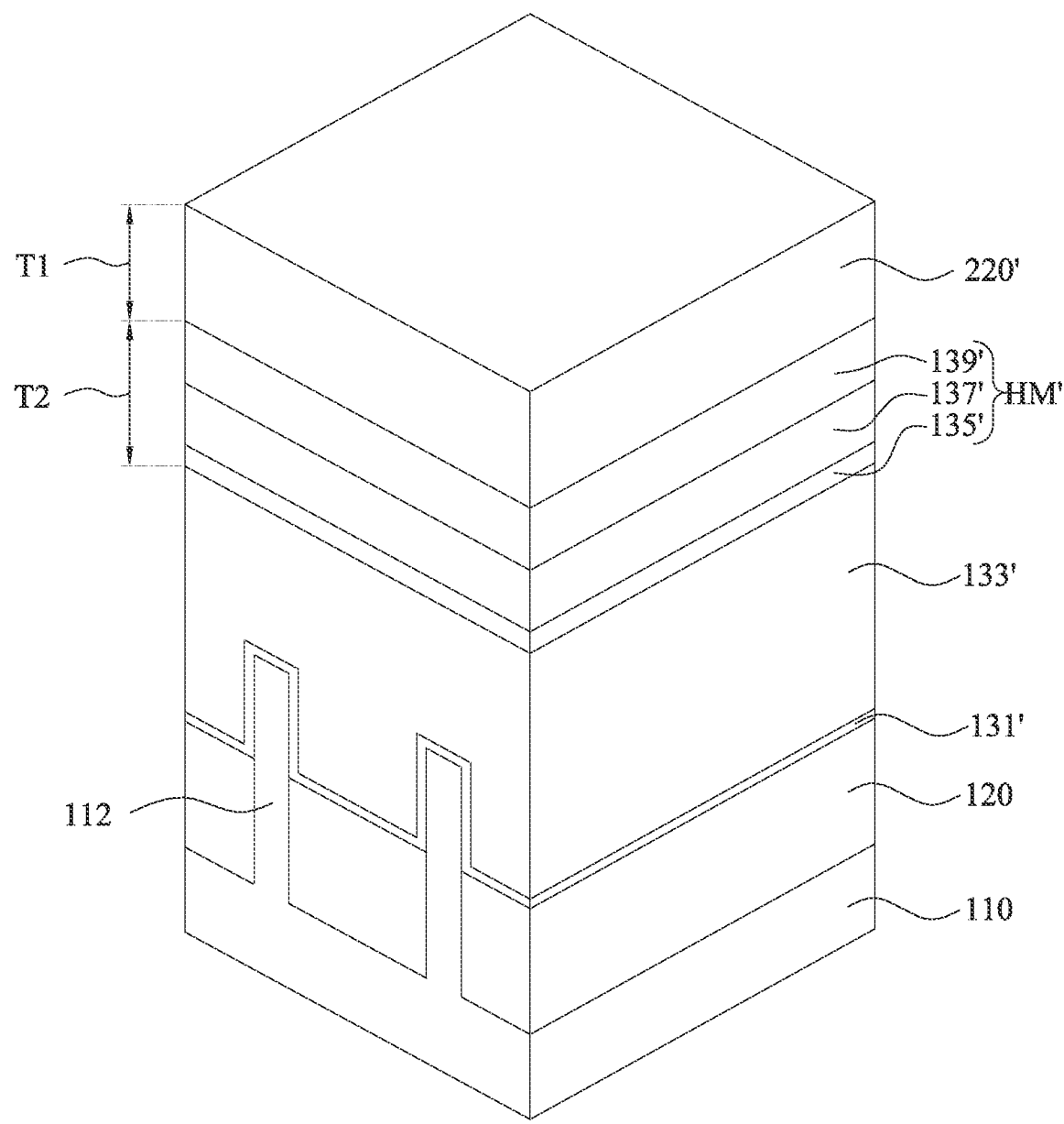
Figure 4B:
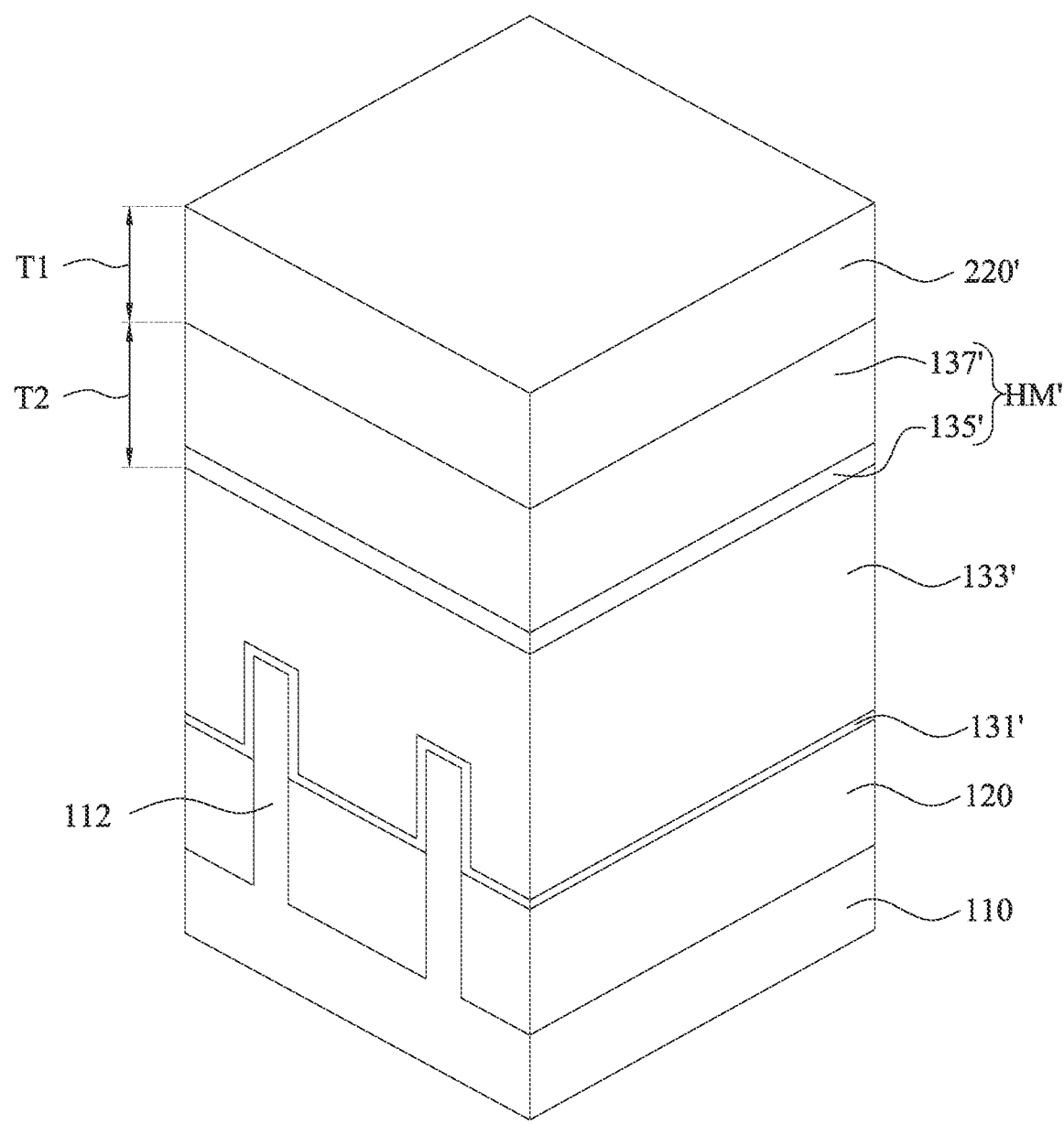

Reference is made to FIGS. 4A and 4B. A hard mask stack HM' is deposited over the dummy gate layer 133'. The hard mask stack HM' include single or multiple dielectric layers and/or metal layers. For example, the hard mask stack HM' includes three sub-layers of hard masks as shown in FIG. 4A or two sub-layers of hard masks as shown in FIG. 4B. It is noted that in some other embodiments, the hard mask stack HM includes more than three sub-layers of hard masks. In FIGS. 4A and 4B, the hard mask stack HM' includes a first hard mask 135' and a second hard mask 137' over the first hard mask 135'. Further, in FIG. 4A, the hard mask stack HM' further includes a third hard mask 139' over the second hard mask 137'. Each of the first hard mask 135', the second hard mask 137', and the third hard mask 139' may be made of amorphous carbon, $SiO_2$, SiN, SiON, SiOCN, or a metal layer. In some embodiments, the first hard mask 135' and the third hard mask 139' are nitride layers, and the second hard mask 137' is an oxide layer, but the present disclosure is not limited thereto. Further, it is noted that the thicknesses of the sub-layers of the hard mask stack HM' are illustrative, and should not limit the claimed scope.

After the formation of the hard mask stack HM', a photoresist bottom layer 220' of a photoresist is formed over the hard mask stack HM'. In some embodiments, the photoresist bottom layer 220' may be made of amorphous carbon, $SiO_2$, SiN, SiON, SiOCN, or combinations thereof. The materials of the photoresist bottom layer 220' and the topmost layer of the hard mask stack HM' (i.e., the third hard mask 139' in FIG. 4A and the second hard mask 137' in FIG. 4B) may be chosen based on providing differing etch selectivity properties. For example, the photoresist bottom layer 220' is a carbon-rich layer and the topmost layer of the hard mask stack HM' is a nitrogen-rich layer or an oxide-rich layer, or vice versa. In some embodiments, the photoresist bottom layer 220' is formed by performing an ion beam deposition process, a sputtering process, a plasma enhanced chemical vapor deposition process, or the like. In some embodiments, a thickness T1 of the photoresist bottom layer 220' is in a range from about 1 nm to about 100 nm. In some embodiments, the thickness T1 of the photoresist bottom layer 220' is less than a thickness T2 of the hard mask stack HM'. In some embodiments, for an amorphous carbon photoresist bottom layer 220', a stress thereof is in a range from about −0.5 Gpa to about −1 Gpa. In some embodiments, the thickness T2 of the hard mask stack HM' is in a range from about 20 nm to about 80 nm.

Figure 5A:
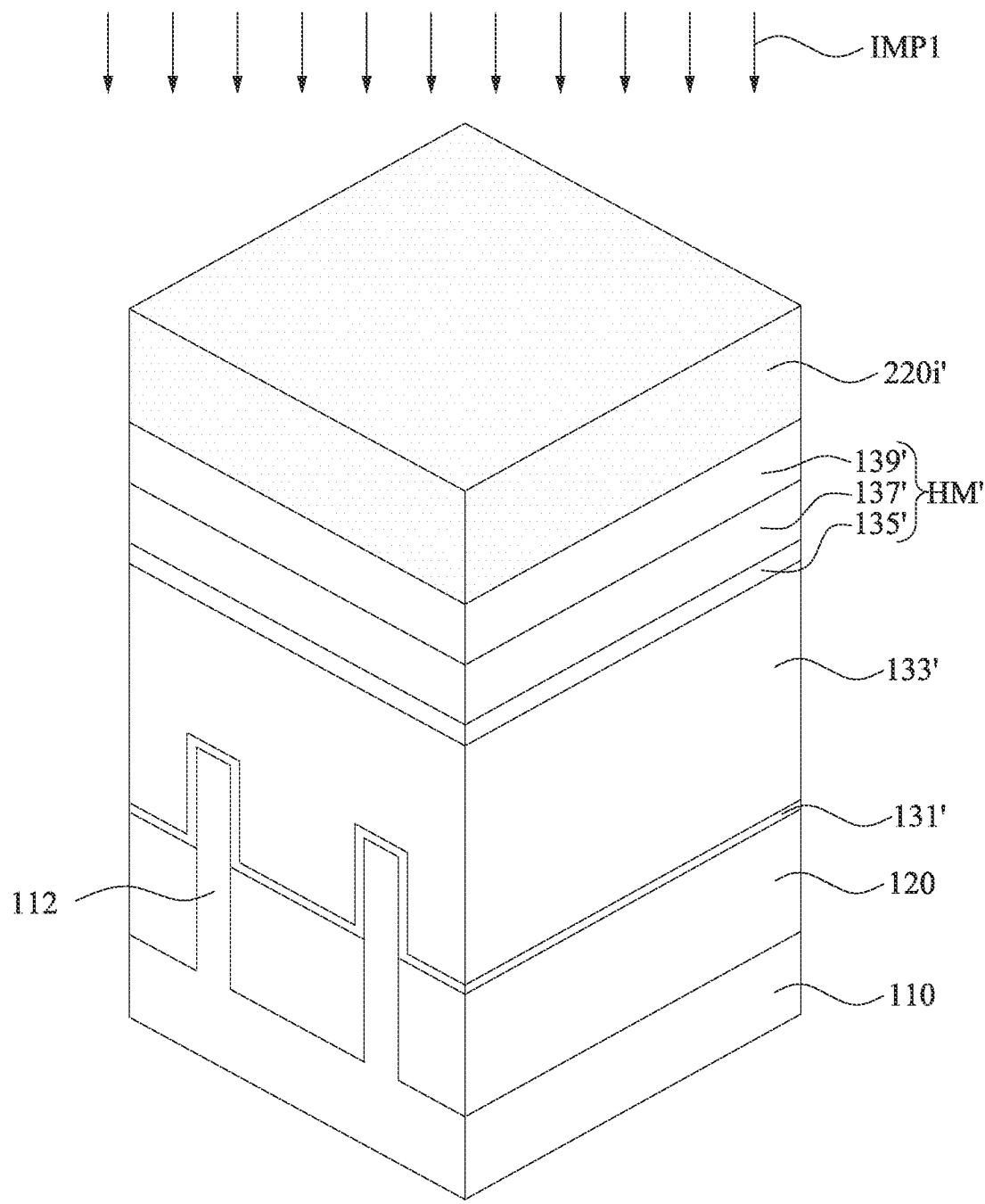
Figure 5B:
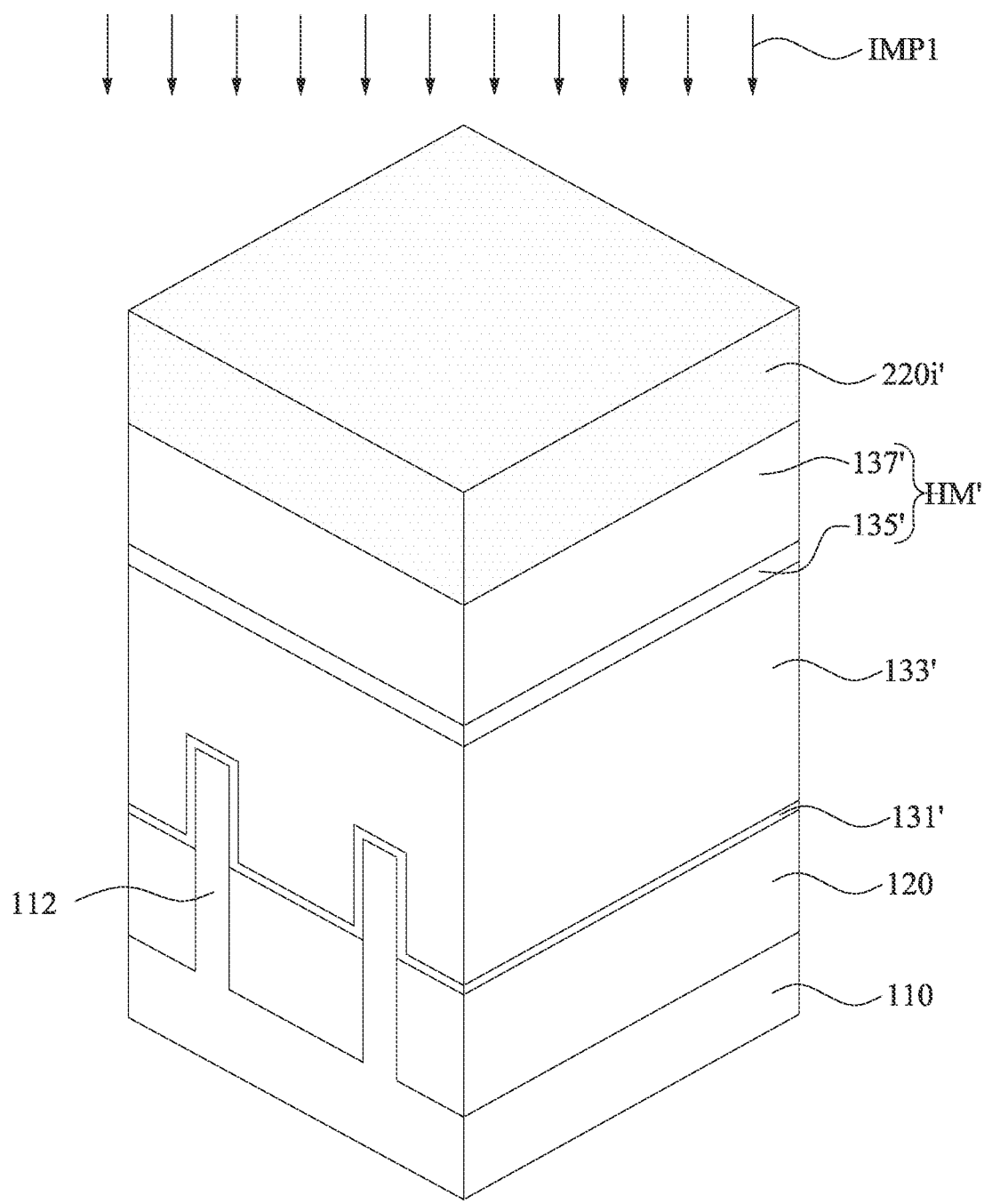

Reference is made to FIGS. 5A and 5B. An implantation process IMP1 is performed to dope one or more impurities (e.g., dopants) into the photoresist bottom layer 220'. Thus, the photoresist bottom layer 220' is referred to be an implanted bottom layer 220i'. In some embodiments, the implantation process IMP1 is an ion bombardment process, which may cause physical reactions of atoms (i.e., breaking bonds) in the photoresist bottom layer 220', but substantially without causing chemical reactions of atoms therein.

Figure 23A:
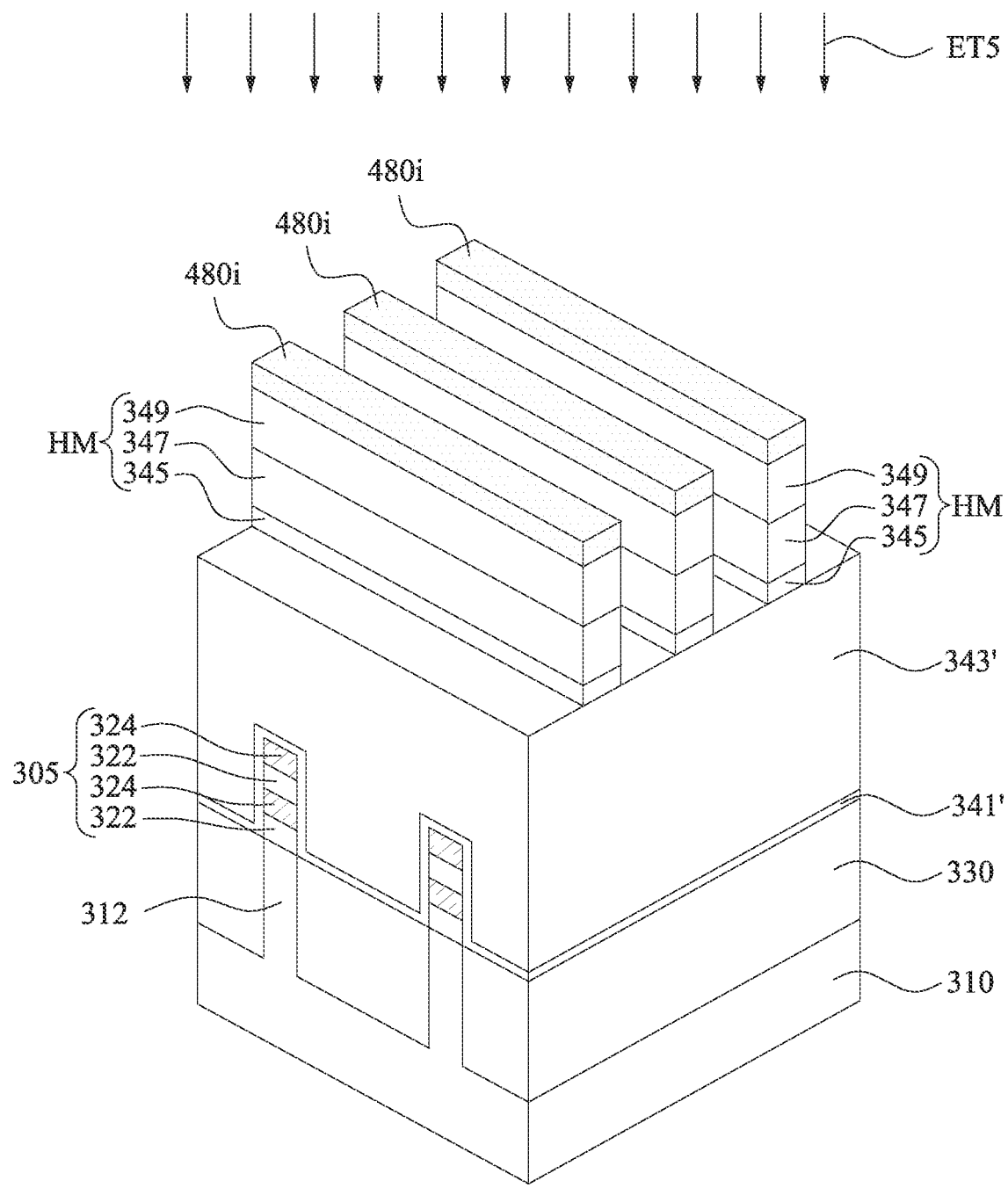
Figure 23B:
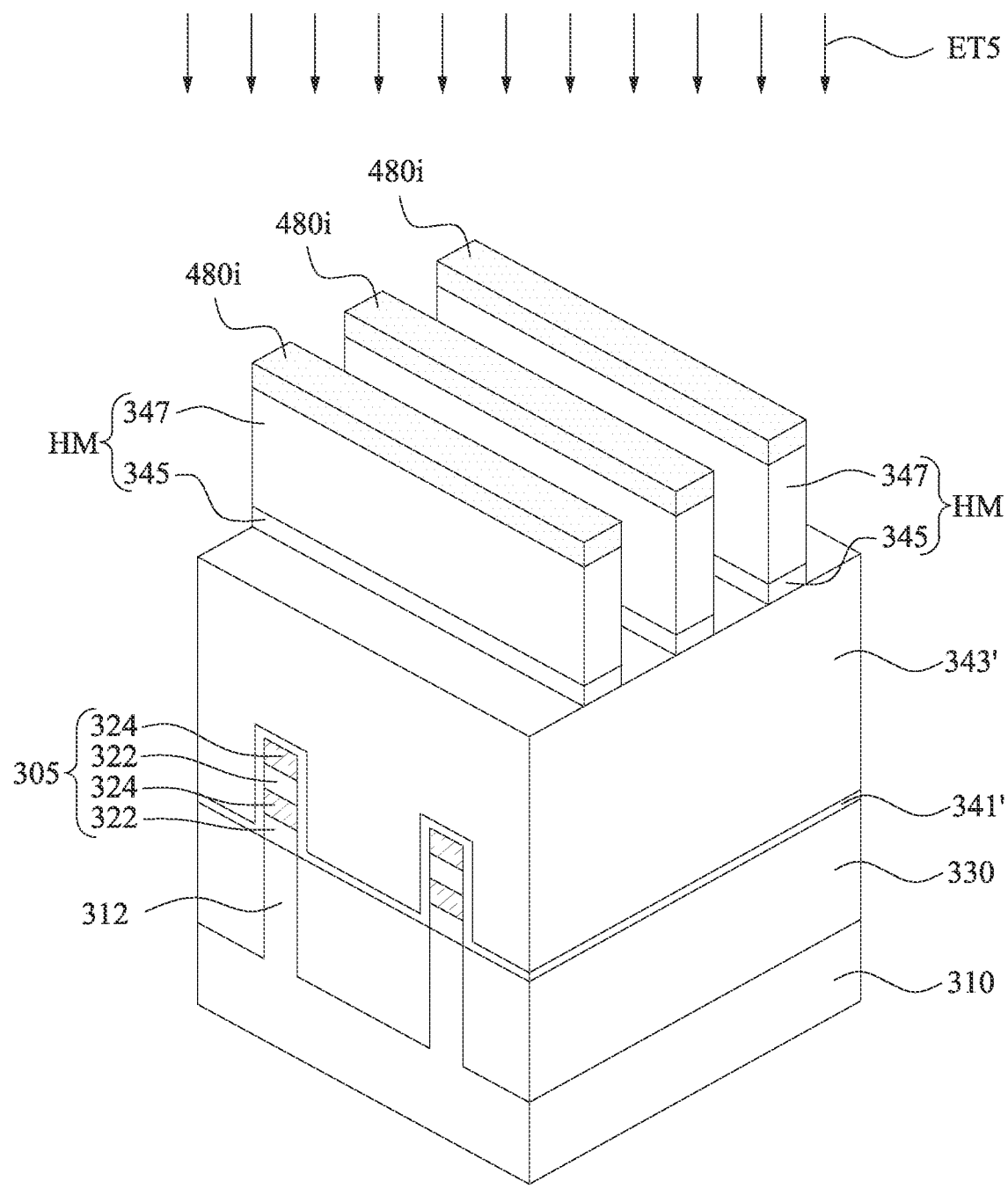

In the scenario that the photoresist bottom layer 220' is an amorphous carbon layer, whose carbon atoms are sp2 hybridized, the implantation process IMP1 may implant carbon dopants into the photoresist bottom layer 220'. The implanted carbon dopants may be bond to the sp2 carbon atoms to form sp3 hybridization states, and the amount of sp3 carbon atoms in the implanted bottom layer 220$i$' is increased. Therefore, the sp3/sp2 ratio of the carbon implanted bottom layer 220$i$' is increased, which provide less compressive stress therein. In some embodiments, the sp3/sp2 ratio of the carbon implanted bottom layer 220$i$' is in a range from about 0.3 to about 1.6. In some embodiments, the carbon implanted bottom layer 220$i$' has a stress in a range from about −0.5 Gpa to about 0 Gpa. That is, the stress of the carbon implanted bottom layer 220$i$' is closer to 0 than the stress of the photoresist bottom layer 220'. Further, the sp3 carbons are more chemical inertness than the sp2 carbons, the etching rate of the implanted bottom layer 220$i$' is also reduced, which will be described in the following second etching process ET2 (FIGS. 23A and 23B).

In the scenario that the photoresist bottom layer 220' is a SiO$_2$, SiN, SiON, or SiOCN layer, the implantation process IMP1 may use a large size of dopants to densify (or restructure) the photoresist bottom layer 220' and to create less compressive stress in the implanted bottom layer 220$i$'. Exemplary dopants may include, but are not limited to, carbon, argon, germanium, xenon, silicon, nitrogen, other suitable species that is able to create a more tensile stress than a material of the photoresist bottom layer 220', or combinations thereof. The microstructure of the implanted bottom layer 220$i$' can be strengthened due to its greater dopant concentration. The dopants in the implanted bottom layer 220$i$' provides an internal tensile stress, which neutralizes the total stress in the implanted bottom layer 220$i$'. Also, the restructured implanted bottom layer 220$i$' has an etching rate different from the photoresist bottom layer 220'.

In some embodiments, the implantation process IMP1 is performed at a dose of about 1E14 ion/cm$^2$ to about 1E16 ion/cm$^2$, at an energy of about 1 keV to about 50 keV, at a tilt angle from 0 degree to about 60 degrees with respect to a normal line of the top surface of the photoresist bottom layer 220', and at a temperature from about −100° C. to about 500° C. Dopant concentration and/or dopant depth of the resultant implanted bottom layer 220$i$' depend on the process conditions of the implantation process IMP1. If the process conditions of the implantation process IMP1 are out of the above selected ranges, the dopant concentration and/or dopant depth in the resultant implanted bottom layer 220$i$' may be unsatisfactory for tuning the stress and/or the etching rate of the implanted bottom layer 220$i$'.

Figure 33:
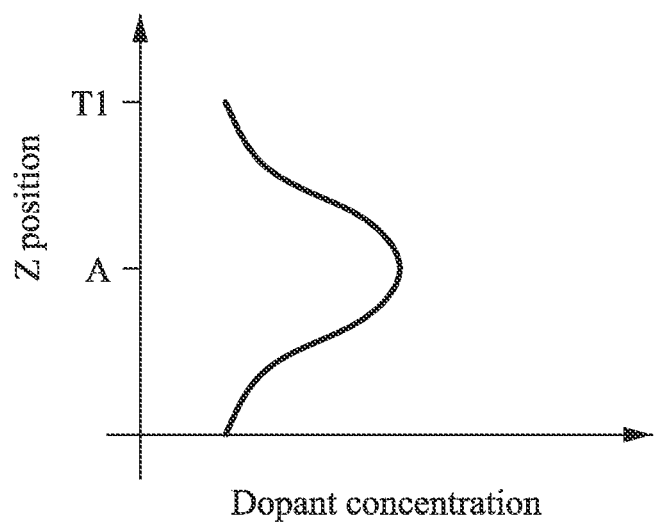
FIG. 33 is a graph illustrating dopant concentration level as a function of a vertical thickness of an implanted bottom layer.

In some embodiments, the implanted bottom layer 220$i$' has a dopant concentration in a range from about 1E18 atoms/cm$^3$ to about 1E20 atoms/cm$^3$. Further, the dopant concentration may vary in a depth direction. FIG. 33 is a graph illustrating dopant concentration level as a function of a vertical thickness of the implanted bottom layer. In some embodiments, an anchor position A of the implantation process IMP1 is set to be in the substantially middle level of the photoresist bottom layer 220', such that the maximum dopant concentration (i.e., peak of the dopant concentration) of the implanted bottom layer 220$i$' may be located in the middle level (i.e., about T1/2) of the implanted bottom layer 220$i$'. As shown in FIG. 33, the dopant concentration distribution in the vertical thickness direction (or depth direction) is a Gaussian distribution, thereby providing a substantially uniform dopant distribution in the implanted bottom layer 220$i$', which is benefit for etching uniformity in the following etching processes.

Figure 6A:
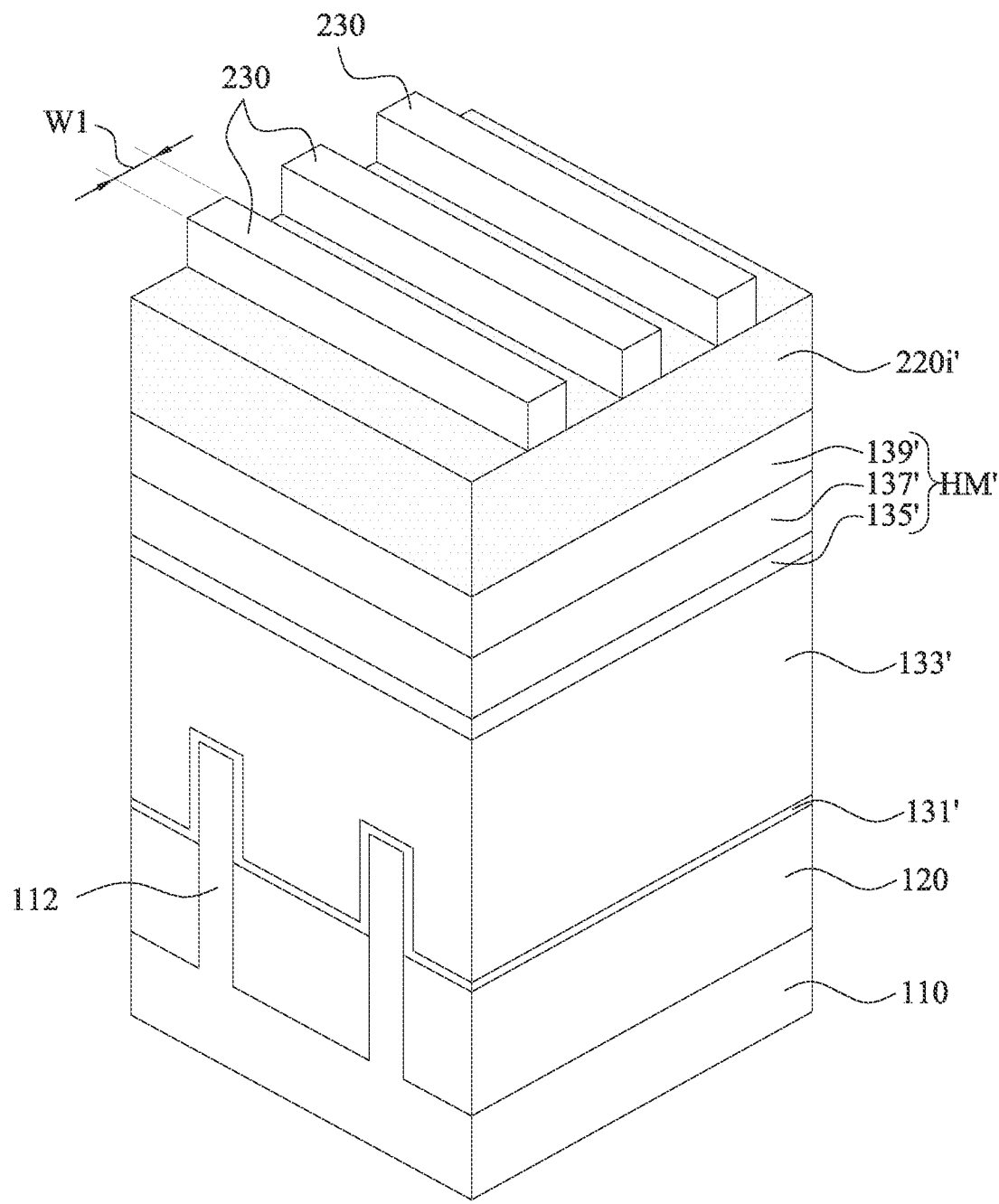
Figure 6B:
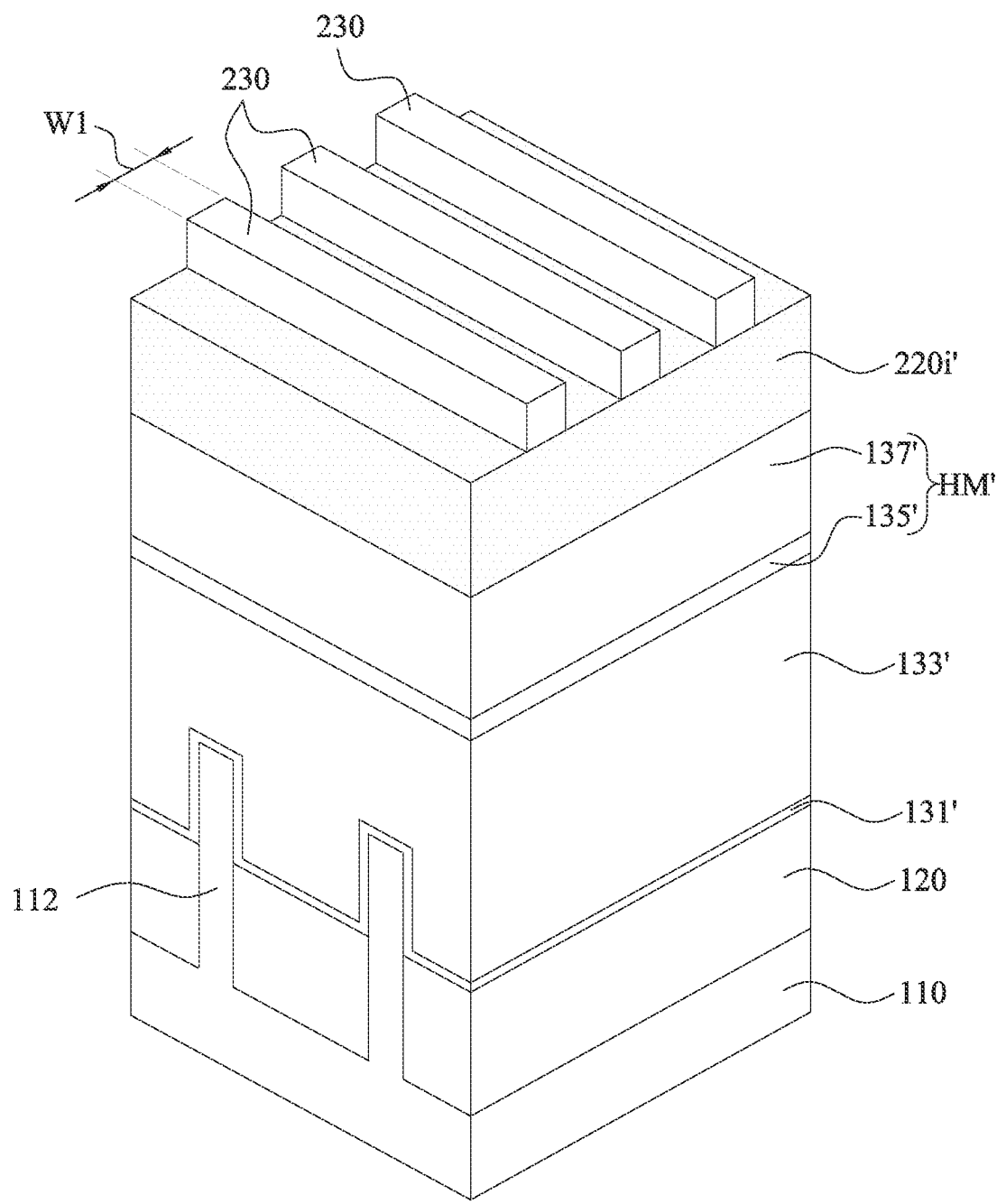

Reference is made to FIGS. 6A and 6B. Patterned photoresist top layers 230 are formed over the implanted bottom layer 220$i$'. For example, as shown in FIGS. 6A and 6B, the patterned photoresist layer 230 may be formed by using a double-patterning technique or a single-patterning technique, according to the desired pitch of the resultant dummy gate stacks 130 (see FIG. 9). Each of the patterned photoresist top layers 230 has a width W1 in a range of about 20 nm to about 30 nm.

Figure 7A:
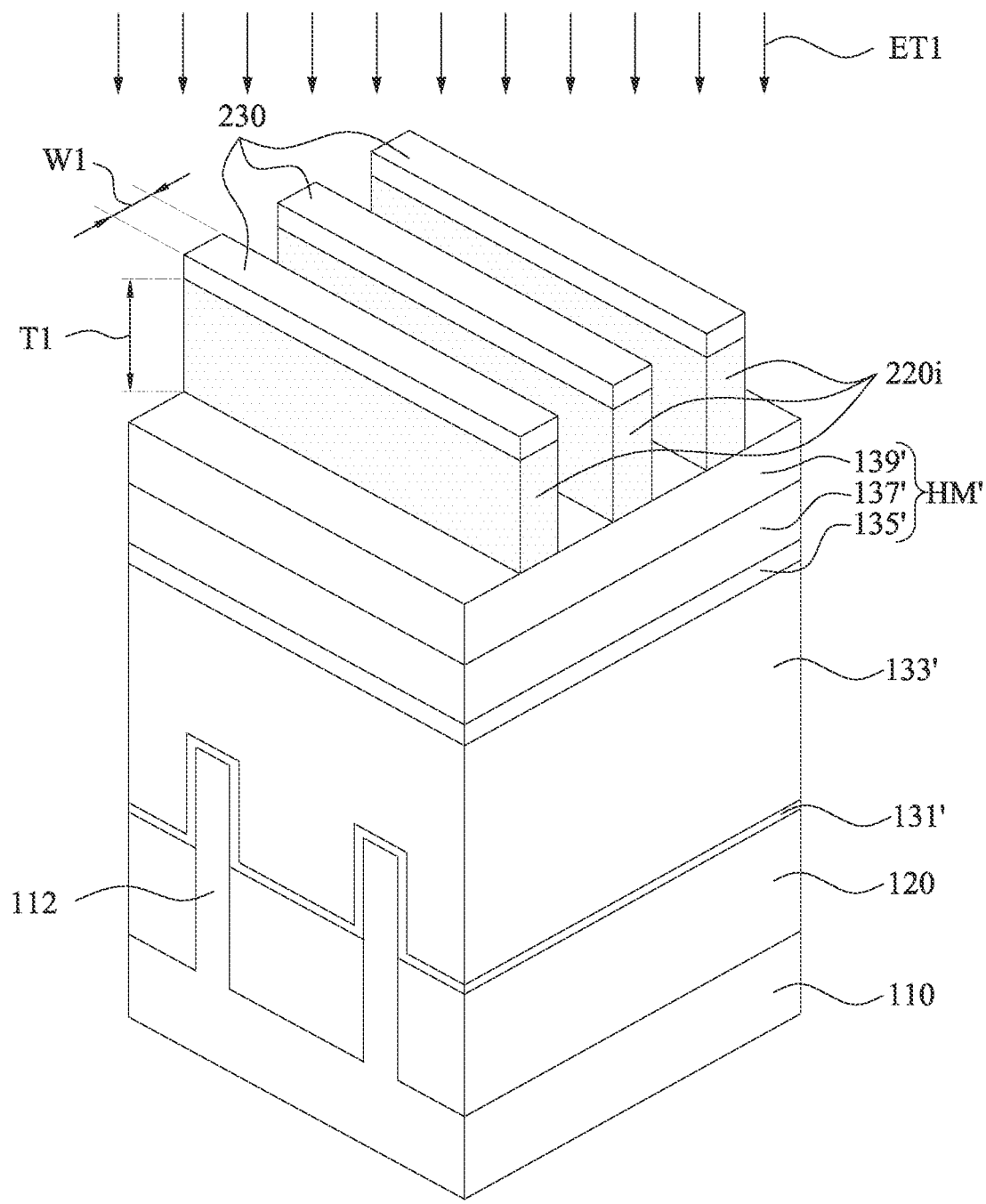
Figure 7B:
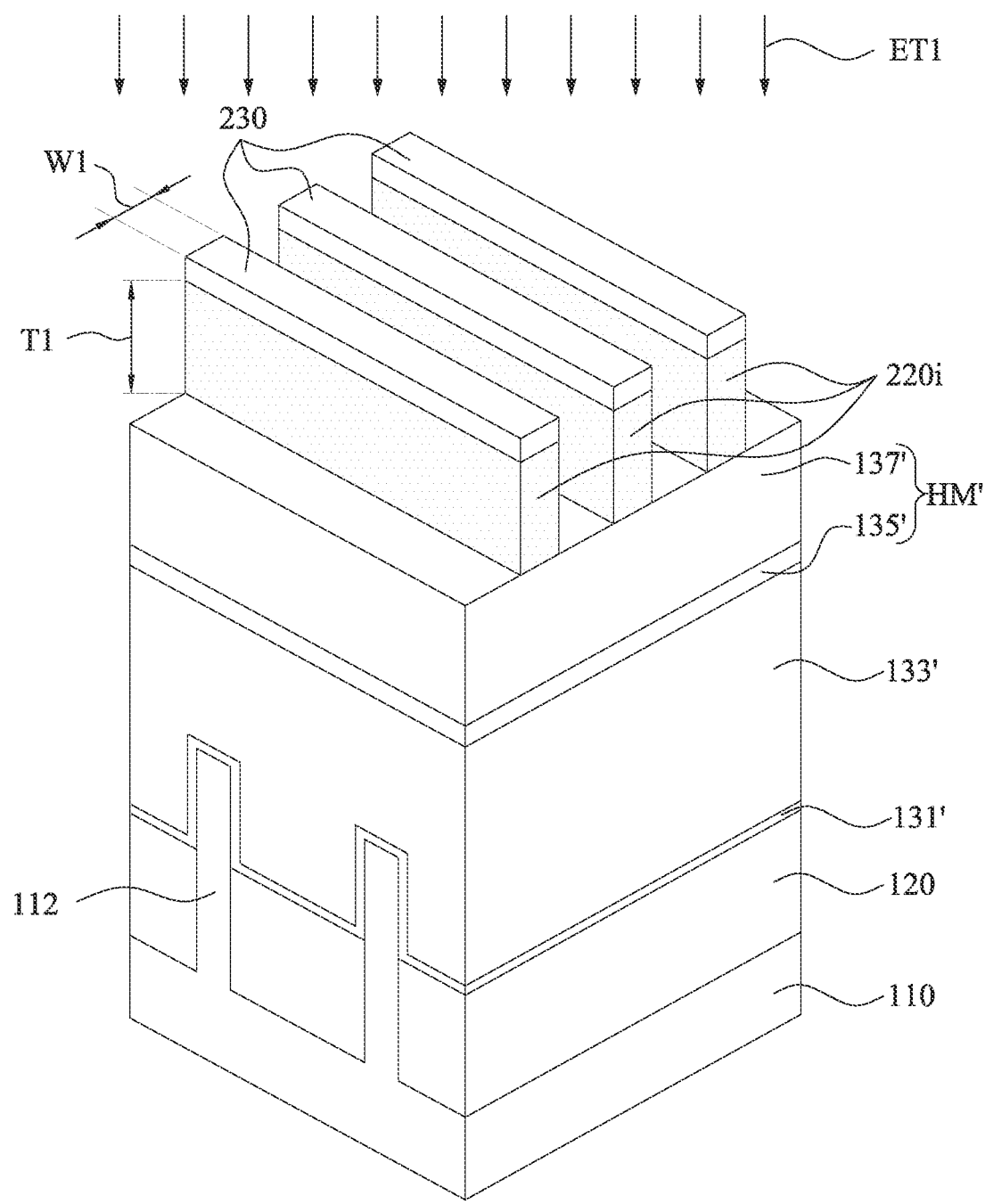

Reference is made to FIGS. 7A and 7B. A first etching process ET1 is performed to pattern the implanted bottom layer 220$i$' by using the patterned photoresist layers 230 as etching masks. The first etching process ET1 is performed to etch the implanted bottom layer 220$i$' while the topmost layer of the hard mask stack HM' acts as an etch stop layer for etching the implanted bottom layer 220$i$'. The first etching process ET1 forms the patterned implantation layer 220$i$ over the implanted bottom layer 220$i$'. The first etching process ET1 may be performed using a dry etching process, wherein a mixture of SO$_2$, O$_2$, and He are used as the etching gases. Further, the first etching process ET1 also removes portions of the patterned photoresist layers 230 as well, such that a vertical thickness of the patterned photoresist layers 230 is reduced.

As shown in FIGS. 7A and 7B, the patterned implantation layer 220$i$ has an aspect ratio, which is a height-to-width ratio (T1/W1), in a range from about 1 to about 4. A pattern with such ranged aspect ratio can be called as a low-aspect-ratio pattern. The low-aspect-ratio patterned implantation layer 220$i$ mitigates the stress unbalance therein during etching, thereby improving the distortions of the patterned implantation layer 220$i$ (and thus the patterned hard mask stacks HM in FIGS. 8A and 8B and the dummy gate electrode layers 133 in FIG. 9).

Figure 8A:
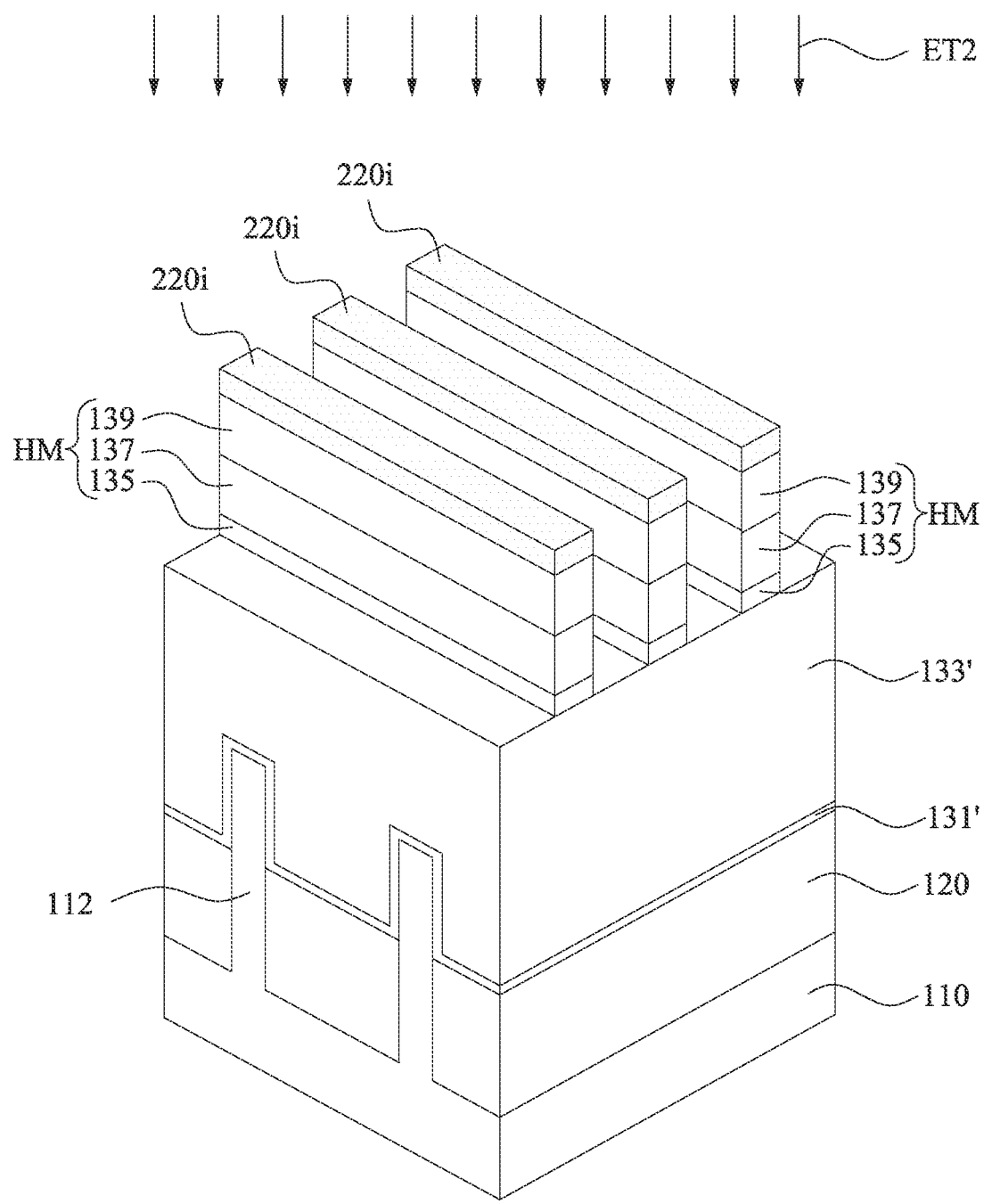
Figure 8B:
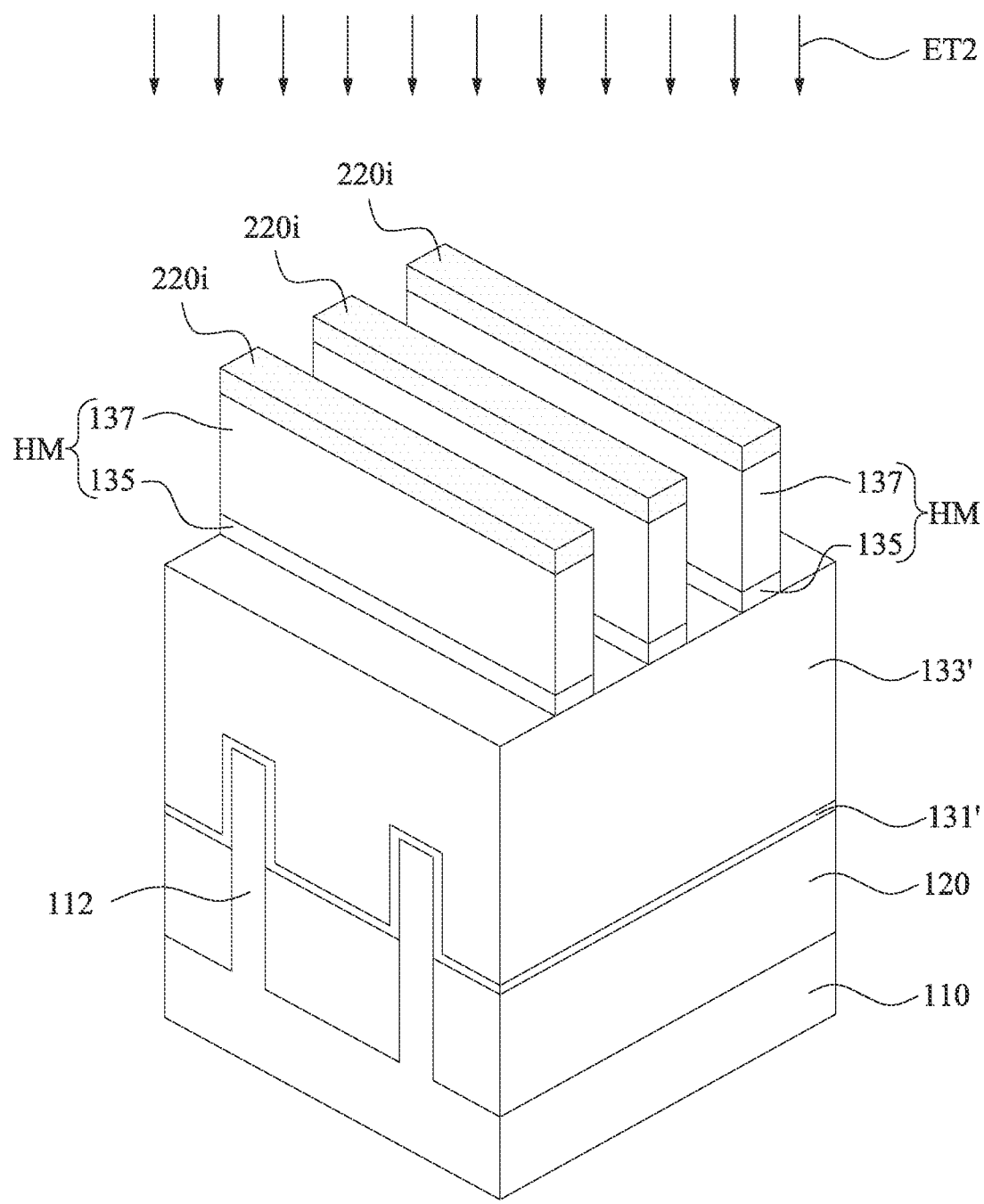

Reference is made to FIGS. 8A and 8B. The patterned photoresist layers 230 are removed, by ashing or etching processes. One or more second etching process(es) ET2 is performed to pattern the hard mask stack HM' by using the patterned implantation layer 220$i$ as etching masks. In FIG. 8A, a first etching operation of the second etching process ET2 is performed to etch the third hard mask 139' and the second hard mask 137' acts as an etch stop layer for etching the third hard mask 139'. Similarly, a second etching operation of the second etching process ET2 is then performed to etch the second hard mask 137' and the first hard mask 135' acts as an etch stop layer for etching the second hard mask 137', and a third etching operation of the second etching process ET2 is subsequently performed to etch the first hard mask 135' and the dummy gate layer 133' acts as an etch stop layer for etching the first hard mask 135'. In FIG. 8B, the first etching operation of the second etching process ET2 is omitted. The second etching process ET2 forms the patterned hard mask stacks HM, each of which includes a first hard mask 135, a second hard mask 137 over the first hard mask 135(, and a third hard mask 139 over the second hard mask 137). The second etching process ET2 may be performed using a dry etching process, wherein CF$_4$, CH$_3$F, C$_4$H$_6$, Ar, HBr, He, or combinations thereof are used as the etching gases. Further, the second etching process ET2 removes portions of the implanted bottom layer 220$i$' as well, such that a vertical thickness of the implanted bottom layer 220$i$' is reduced. As mentioned above, due to the implantation process IMP1, the implanted bottom layer 220$i$' is restructured and thus has a high etch resistance under the second etching process ET2. That is, the second etching process ET2 is not easy to etch the implanted bottom layer 220*i*', and this is one of the reasons that the implanted bottom layer 220*i*' can be low-aspect-ratio patterns (or small vertical thickness T1). As such, after the second etching process ET2, portions of the implanted bottom layer 220*i*' remain on the patterned hard mask stacks HM, which protects the patterned hard mask stacks HM from damage during the second etching process ET2.

Figure 9:
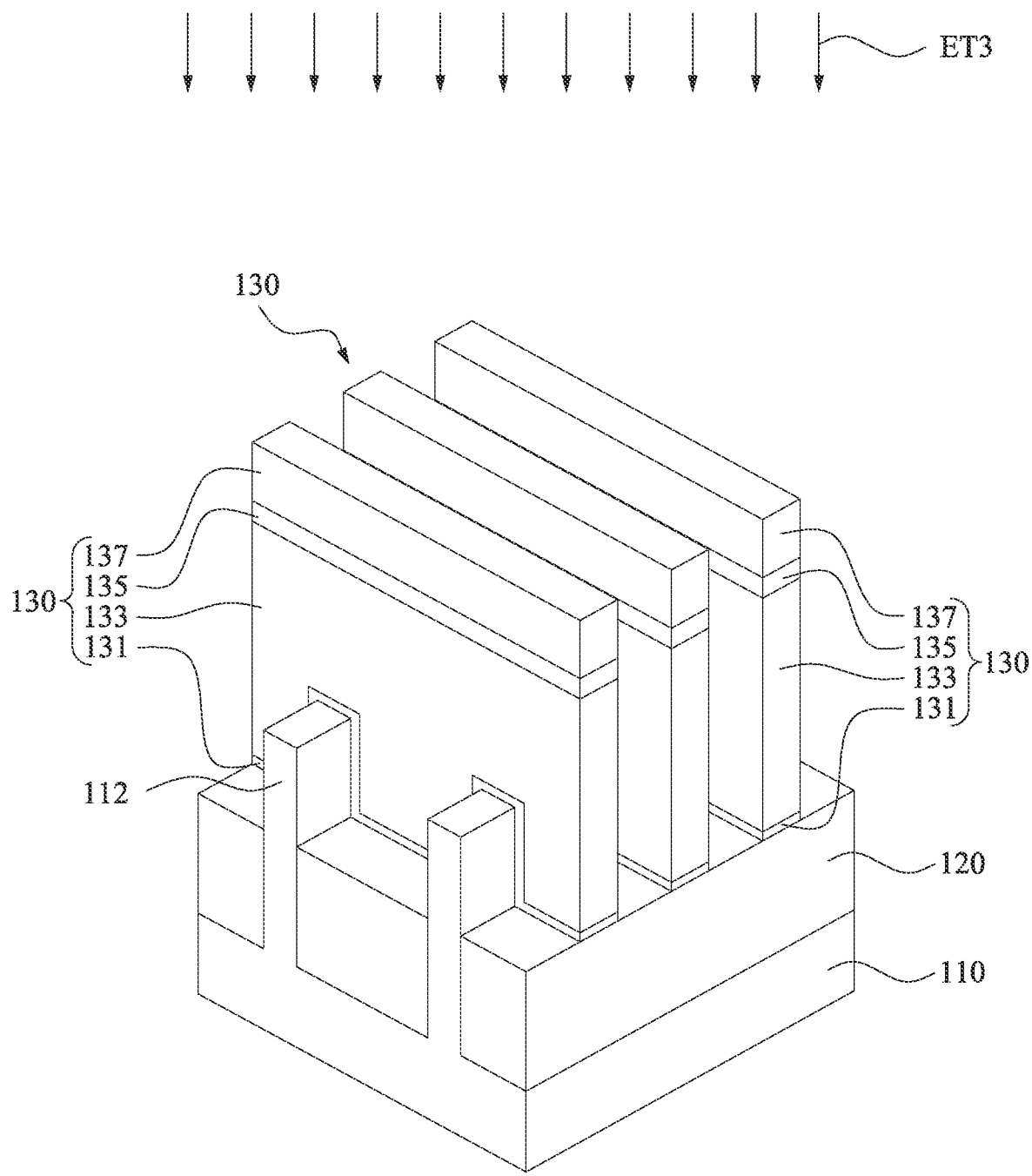

Reference is made to FIG. 9. The remaining implanted bottom layers 220*i*' are removed by performing an etching process. A third etching process ET3 is performed to pattern the dummy gate layer 133' and the dummy dielectric layer 131' by using the patterned hard mask stacks HM as etching masks. The third etching process ET3 removes portions of the patterned hard mask stacks HM as well. For example, the third hard masks 139 are removed, and/or a vertical thickness of the second hard mask 137 is reduced.

After the preformation of the third etching process ET3, dummy gate structures 130 are formed over the substrate 110. Each of the dummy gate structures 130 includes the dummy dielectric layer 131, the dummy gate electrode layer 133, and the hard mask stack including, for example but not limited to, the first hard mask 135 and the second hard mask 137.

Figure 10:
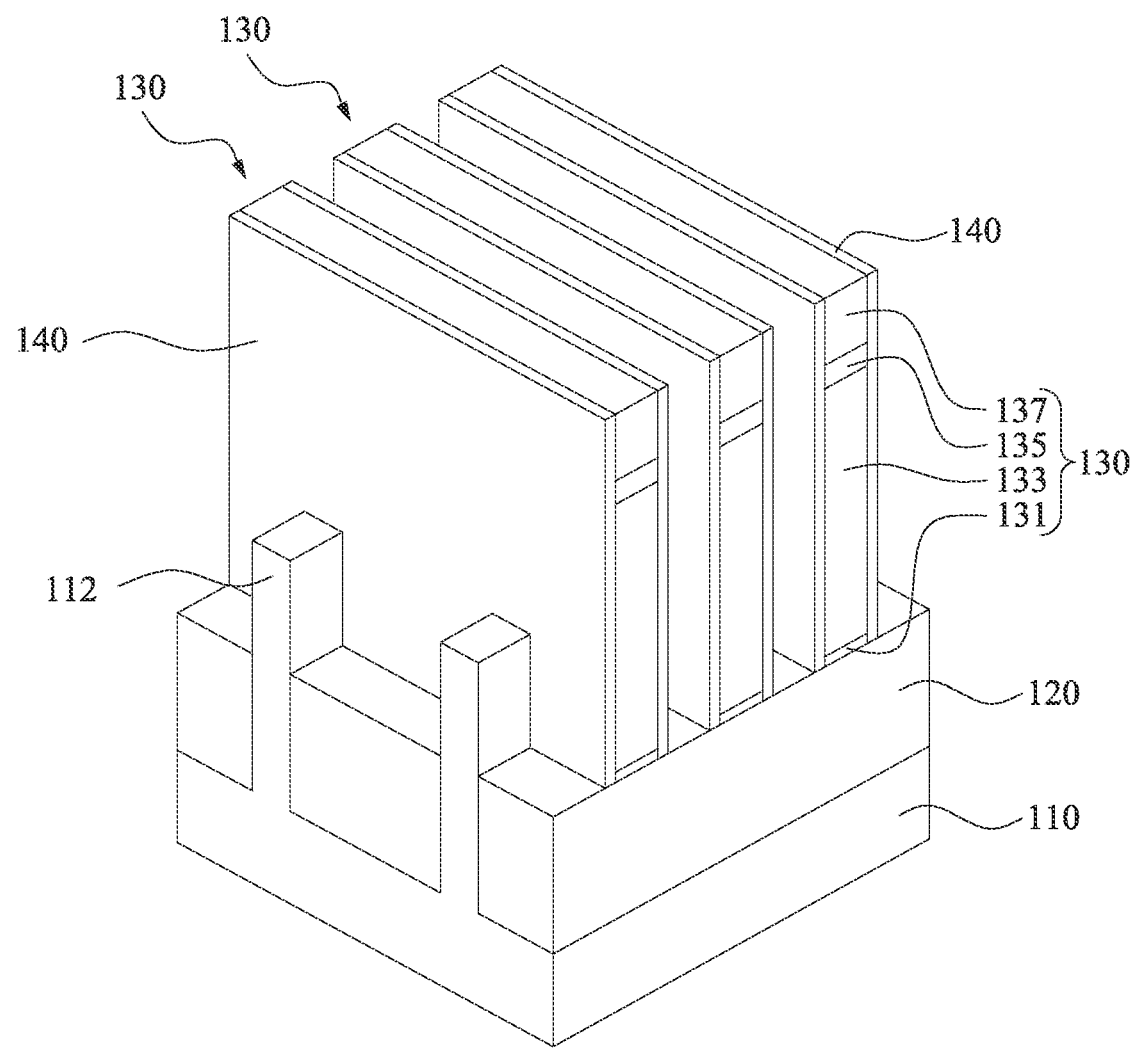

Reference is made to FIG. 10. After formation of the dummy gate structures 130 is completed, a spacer structure 140 is formed on sidewalls of the dummy gate structures 130 to surround the dummy gate structures 130. In some embodiments of the gate spacer formation operations, a spacer material layer is deposited on the substrate 110. The spacer material layer may be a conformal layer that is subsequently etched back to form the spacer structure 140. In some embodiments, the spacer material layer includes multiple layers, such as a first spacer layer and a second spacer layer formed over the first spacer layer. The first and second spacer layers each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers may be formed by depositing in sequence two different dielectric materials over the dummy gate structures 130 using processes such as, an ALD process, a PEALD (plasma enhanced ALD) process, a PECVD process, a subatmospheric CVD (SACVD) process, or other suitable process. An anisotropic etching process is then performed on the deposited spacer layers to expose portions of the semiconductor fins 112 not covered by the dummy gate structures 130 (e.g., in the source/drain regions of the semiconductor fins 112). Portions of the spacer layers directly above the dummy gate structures 130 may be removed by this anisotropic etching process. Portions of the spacer layers on sidewalls of the dummy gate structures 130 may remain, forming gate sidewall spacers, which are denoted as the spacer structures 140, for the sake of simplicity. In some embodiments, the first spacer layer is formed of silicon oxide that has a lower dielectric constant than silicon nitride, and the second spacer layer is formed of silicon nitride that has a higher etch resistance against subsequent etching processing (e.g., etching source/drain recesses in the semiconductor fins 112) than silicon oxide. In some embodiments, the spacer structure 140 may be used to offset subsequently formed doped regions, such as source/drain regions. The spacer structure 140 may further be used for designing or modifying the source/drain region profile.

Figure 11:
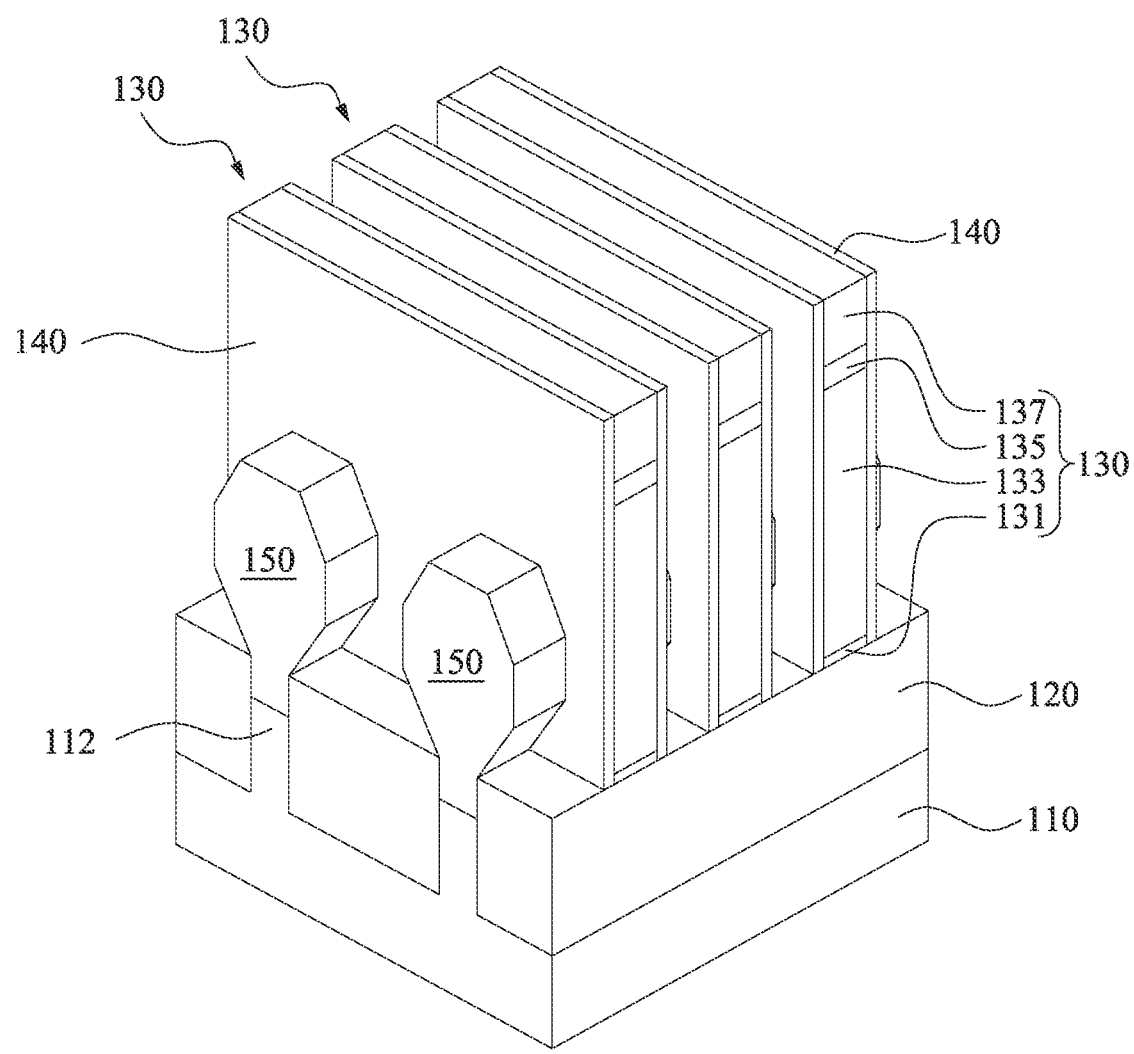
Figure 11:
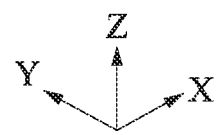

Reference is made to FIG. 11. After the formation of the spacer structure 140 is completed, source/drain epitaxial structures 150 are formed on source/drain regions of the semiconductor fins 112 that are not covered by the dummy gate structures 130 and the spacer structures 140. In some embodiments, formation of the source/drain epitaxial structures 150 includes recessing source/drain regions of the semiconductor fins 112, followed by epitaxially growing semiconductor materials in the recessed source/drain regions of the semiconductor fins 112.

The source/drain regions of the semiconductor fins 112 can be recessed using suitable selective etching processing that attacks the semiconductor fins 112, but barely attacks the spacer structures 140 and the second hard masks 137 of the dummy gate structures 130. For example, recessing the semiconductor fins 112 may be performed by a dry chemical etch with a plasma source and an etchant gas. The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 112 at a faster etch rate than it etches the spacer structures 140 and the second hard masks 137 of the dummy gate structures 130. In some other embodiments, recessing the semiconductor fin 112 may be performed by a wet chemical etch, such as ammonium peroxide mixture (APM), NH$_4$OH, tetramethylammonium hydroxide (TMAH), combinations thereof, or the like, which etches the semiconductor fins 112 at a faster etch rate than it etches the spacer structures 140 and the second hard masks 137 of the dummy gate structures 130. In some other embodiments, recessing the semiconductor fins 112 may be performed by a combination of a dry chemical etch and a wet chemical etch.

Once recesses are created in the source/drain regions of the semiconductor fins 112, the source/drain epitaxial structures 150 are formed in the source/drain recesses in the semiconductor fins 112 by using one or more epitaxy or epitaxial (epi) processes that provides one or more epitaxial materials on the semiconductor fins 112. During the epitaxial growth process, the spacer structures 140 limit the one or more epitaxial materials to source/drain regions in the semiconductor fins 112. In some embodiments, the lattice constants of the source/drain epitaxial structures 150 are different from the lattice constant of the semiconductor fins 112, so that the channel region in the semiconductor fins 112 and between the source/drain epitaxial structures 150 can be strained or stressed by the source/drain epitaxial structures 150 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112.

In some embodiments, the source/drain epitaxial structures 150 include Ge, Si, GaAs, AlGaAs, SiGe, GaAsP, SiP, or other suitable material. The source/drain epitaxial structures 150 may be in-situ doped during the epitaxial process by introducing doping species including: p-type dopants, such as boron or BF$_2$; n-type dopants, such as phosphorus or arsenic; and/or other suitable dopants including combinations thereof. If the source/drain epitaxial structures 150 are not in-situ doped, an implantation process (i.e., a junction implant process) is performed to dope the source/drain epitaxial structures 150. In some exemplary embodiments, the source/drain epitaxial structures 150 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed semiconductor fins 112 in the p-type device regions. The mask may then be removed. Subsequently, a mask, such as a photoresist, may be formed over the p-type device region while exposing the n-type device regions, and n-type epitaxial structures may be formed on the exposed semiconductor fins 112 in the n-type device region. The mask may then be removed.

Once the source/drain epitaxial structures 150 are formed, an annealing process can be performed to activate the p-type dopants or n-type dopants in the source/drain epitaxial structures 150. The annealing process may be, for example, a rapid thermal anneal (RTA), a laser anneal, a millisecond thermal annealing (MSA) process or the like.

Figure 12:
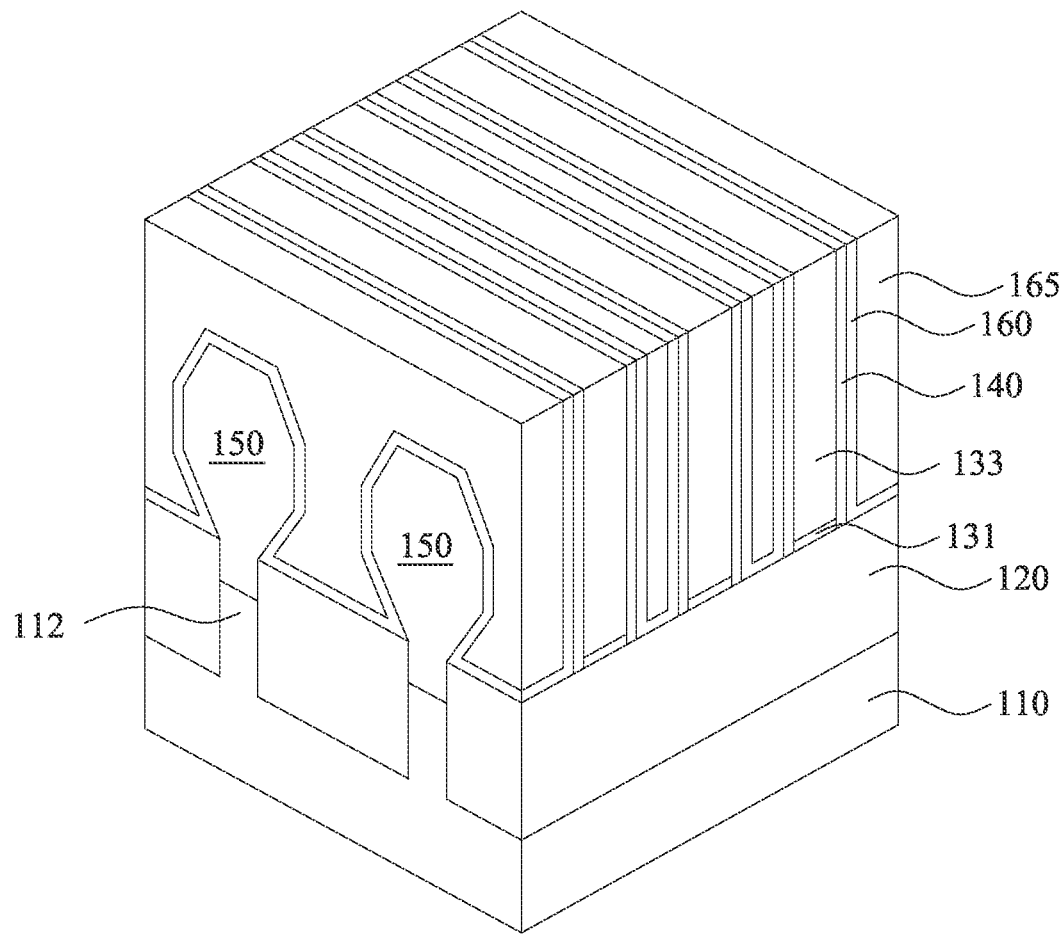
Figure 12:
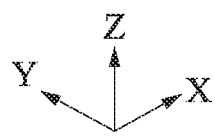

Reference is made to FIG. 12. An interlayer dielectric (ILD) layer 165 is formed on the substrate 110. In some embodiments, a contact etch stop layer (CESL) 160 is also formed prior to forming the ILD layer 165. In some embodiments, the CESL 160 includes a silicon nitride layer, a silicon oxynitride layer, and/or other suitable materials having a different etch selectivity than the ILD layer 165. The CESL 160 may be formed by plasma-enhanced chemical vapor deposition (PECVD) process and/or other suitable deposition or oxidation processes. In some embodiments, the ILD layer 165 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 160. The ILD layer 165 may be deposited by a subatmospheric CVD (SACVD) process, a flowable CVD process, or other suitable deposition technique. In some embodiments, after formation of the ILD layer 165, the wafer may be subject to a high thermal budget process to anneal the ILD layer 165.

In some examples, after forming the ILD layer 165, a planarization process may be performed to remove excessive materials of the ILD layer 165. For example, a planarization process includes a chemical mechanical planarization (CMP) process which removes portions of the ILD layer 165 (and the CESL 160, if present) overlying the dummy gate structures 130. In some embodiments, the CMP process also removes the hard masks 135 and 137 (as shown in FIG. 11) and exposes the dummy gate electrode layers 133.

Figure 13:
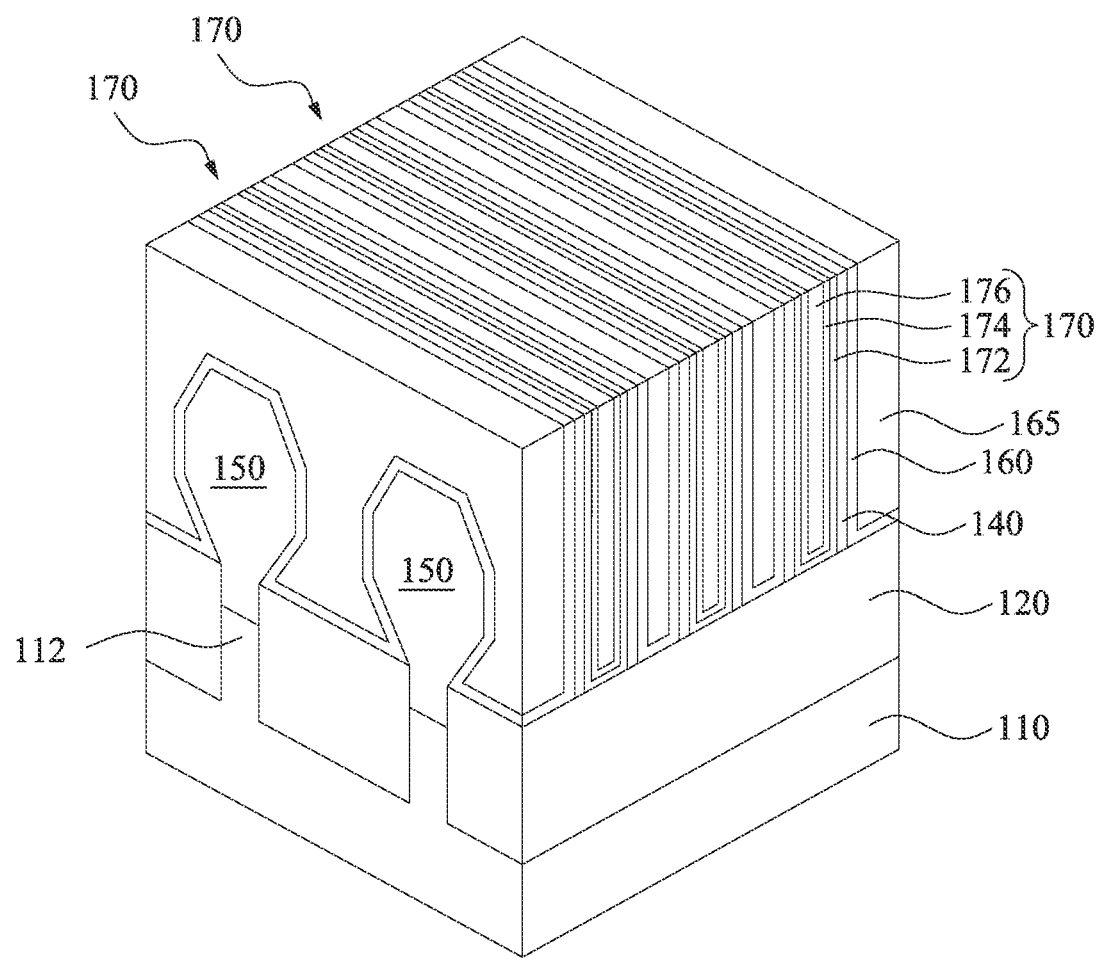

Reference is made to FIG. 13. The dummy gate electrode layers 133 and the dummy gate dielectric layers 131 (see FIG. 12) are removed, resulting in gate trenches between corresponding spacer structures 140. The dummy gate electrode layers 133 and the dummy gate dielectric layers 131 are removed using a selective etching process (e.g., selective dry etching, selective wet etching, or combinations thereof) that etches materials in the dummy gate electrode layers 133 and the dummy gate dielectric layers 131 at a faster etch rate than it etches other materials (e.g., the spacer structures 140, the CESL 160, and/or the ILD layer 165).

Thereafter, replacement gate structures 170 are respectively formed in the gate trenches. The gate structures 170 may be the final gates of FinFETs. The final gate structures each may be a high-k/metal gate stack, however other compositions are possible. In some embodiments, each of the gate structures 170 forms the gate associated with the three-sides of the channel region provided by the semiconductor fins 112. Stated another way, each of the gate structures 170 wraps around the semiconductor fins 112 on three sides. In various embodiments, the (high-k/metal) gate structure 170 includes a gate dielectric layer 172 lining the gate trench and a gate electrode over the gate dielectric layer 172. The gate electrode may include a work function metal layer 174 formed over the gate dielectric layer 172 and a fill metal 176 formed over the work function metal layer 174 and filling a remainder of gate trenches. The gate dielectric layer 172 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 174 and/or fill metal 176 used within high-k/metal gate structures 170 may include a metal, metal alloy, or metal silicide. Formation of the high-k/metal gate structures 170 may include multiple deposition processes to form various gate materials, one or more liner layers, and one or more CMP processes to remove excessive gate materials.

In some embodiments, the interfacial layer of the gate dielectric layer 172 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 172 may include hafnium oxide ($HfO_2$). Alternatively, the gate dielectric layer 172 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 174 may include work function metals to provide a suitable work function for the high-k/metal gate structures 170. For an n-type FinFET, the work function metal layer 174 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 174 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 176 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 14:
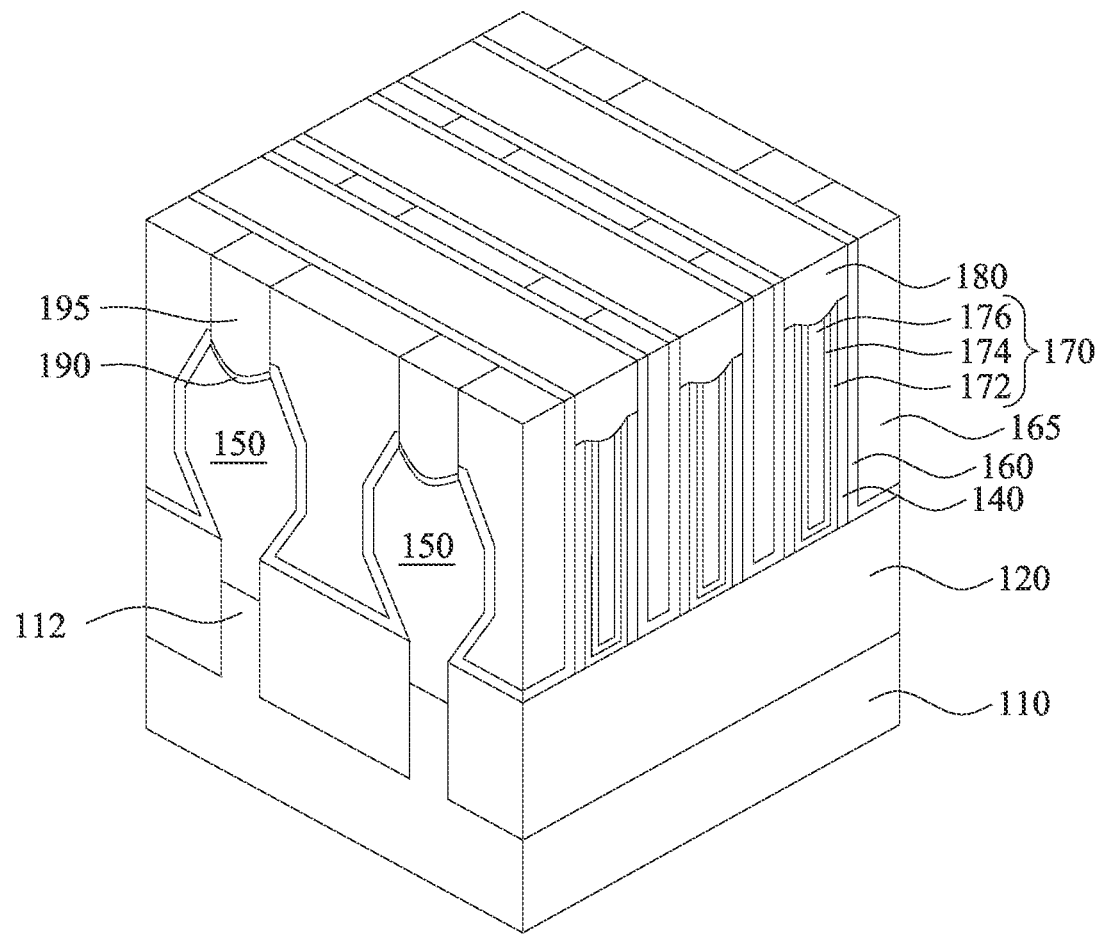
Figure 14:
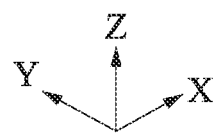

Reference is made to FIG. 14. Optionally, an etching back process is performed to etch back the replacement gate structures 170 and the spacer structures 140, resulting in recesses over the etched-back gate structures 170 and the etched-back spacer structures 140. In some embodiments, because the materials of the replacement gate structures 170 have a different etch selectivity than the spacer structures 140, a first selective etching process may be initially performed to etch back the replacement gate structures 170 to lower the replacement gate structures 170. Subsequently, a second selective etching process is performed to lower the spacer structures 140. As a result, the top surfaces of the replacement gate structures 170 may be at a different level than the top surfaces of the spacer structures 140.

Subsequently, dielectric caps 180 are respectively formed in the recesses. For example, a dielectric cap layer is deposited over the substrate 110 until the recesses are overfilled. The dielectric cap layer includes SiN, SiC, SiCN, SiON, SiCON, combinations thereof or the like, and is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the cap layer outside the recesses, leaving portions of the dielectric cap layer in the recesses to serve as the dielectric caps 180.

Source/drain contacts 195 are formed extending through the ILD layer 165. Formation of the source/drain contacts 195 includes, by way of example and not limitation, performing one or more etching processes to form contact openings extending though the ILD layer 165 to expose the source/drain epitaxial structures 150, depositing one or more metal materials overfilling the contact openings, and then performing a CMP process to remove excessive metal materials outside the contact openings. In some embodiments, the one or more etching processes are selective etching that etches the ILD layer 165 at a faster etch rate than etching the dielectric caps 180 and the CESL 160. As a result, the selective etching is performed using the dielectric caps 180 and the CESL 160 as an etch mask, such that the contact openings and hence source/drain contacts 195 are formed self-aligned to the source/drain epitaxial structures 150 without using an additional photolithography process. In that case, the dielectric caps 180 allowing for forming the source/drain contacts 195 in a self-aligned manner can be called self-aligned-contact (SAC) caps 180.

In some embodiments, metal alloy layers 190 are respectively formed above the source/drain epitaxial structures 150 prior to forming the source/drain contacts 195. The frontside metal alloy layers 190, which may be silicide layers, are respectively formed in the trenches and over the exposed source/drain epitaxial structures 150 by a self-aligned silicide (salicide) process. The silicide process converts the surface portions of the source/drain epitaxial structures 150 into the silicide contacts. Silicide processing involves deposition of a metal that undergoes a silicidation reaction with silicon (Si). In order to form silicide contacts on the source/drain epitaxial structures 150, a metal material is blanket deposited on the source/drain epitaxial structures 150. After heating the wafer to a temperature at which the metal reacts with the silicon of the source/drain epitaxial structures 150 to form contacts, unreacted metal is removed. The silicide contacts remain over the source/drain epitaxial structures 150, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 190 may include germanium.

As mentioned above, the photoresist bottom layer 220' (see FIGS. 4A and 4B) are implanted to be implanted bottom layer 220i', which has high etching resistance and less stress, the distortion of the dummy gate structures 130 can be improved. Further, the following formed metal gate structures 170, which inherit the profile of the dummy gate structures 130, have small line width variations. That is, the sidewalls of the gate structures 170 have low surface roughness, i.e., the gate structures 170 are straight in a top view. Therefore, the short issue between the gate structures 170 and the source/drain contacts 195 can be improved.

FIGS. 15-32 illustrate a method for manufacturing the semiconductor device at various stages in accordance with some embodiments of the present disclosure. In addition to the semiconductor device, FIGS. 15-32 depict X-axis, Y-axis, and Z-axis directions. In some embodiments, the semiconductor device shown in FIGS. 15-32 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 15:
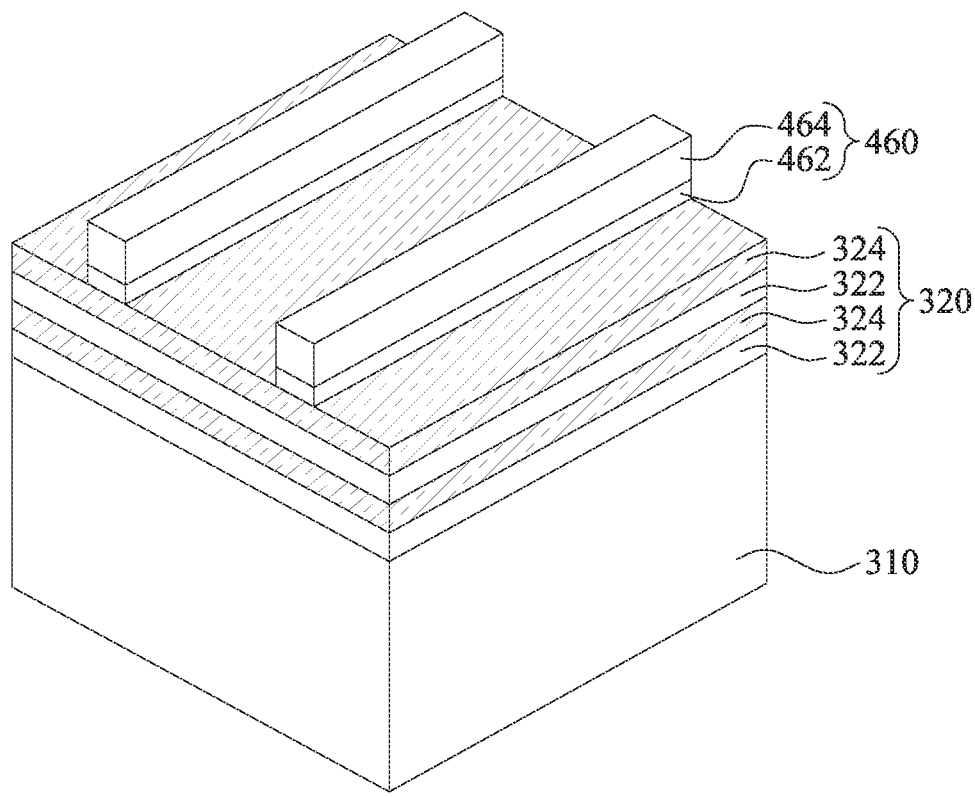
FIGS. 15-32 illustrate a method for manufacturing the semiconductor device at various stages in accordance with some embodiments of the present disclosure.

Reference is made to FIG. 15. A substrate 310 is provided. Materials, configurations, dimensions, processes and/or operations regarding the substrate 310 are similar to or the same as the substrate 110 of FIG. 1. A stacked structure 320 is formed on the substrate 310 through epitaxy, such that the stacked structure 320 forms crystalline layers. The stacked structure 320 includes first semiconductor layers 322 and second semiconductor layers 324 stacked alternately. The first semiconductor layers 322 and the second semiconductor layers 324 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 322 and the second semiconductor layers 324 are made of Si, a Si compound, SiGe, Ge or a Ge compound. In FIG. 15, two layers of the first semiconductor layer 322 and two layers of the second semiconductor layer 324 are disposed. However, the number of the layers are not limited to two, and may be as small as 1 (each layer) and in some embodiments, 3-10 layers of each of the first and second semiconductor layers are formed. By adjusting the numbers of the stacked layers, a driving current of the GAA FET device can be adjusted.

In some embodiments, the first semiconductor layers 322 can be SiGe layers having a germanium atomic percentage greater than zero. In some embodiments, the second semiconductor layers 324 may be pure silicon layers that are free from germanium. The second semiconductor layers 324 may also be substantially pure silicon layers, for example, with a germanium atomic percentage lower than about 1 percent.

The second semiconductor layers 324 or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the second semiconductor layers 324 to define a channel or channels of the semiconductor device is further discussed below.

As described above, the second semiconductor layers 324 may serve as channel region(s) for a subsequently-formed semiconductor device and the thickness is chosen based on device performance considerations. The first semiconductor layers 322 in channel regions(s) may eventually be removed and serve to define a vertical distance between adjacent channel region(s) for a subsequently-formed multi-gate device and the thickness is chosen based on device performance considerations. Accordingly, the first semiconductor layers 322 may also be referred to as sacrificial layers, and the second semiconductor layers 324 may also be referred to as channel layers.

Subsequently, a patterned mask layer 460 is formed above the stacked structure 320. In some embodiments, the patterned mask layer 460 includes a first mask layer 462 and a second mask layer 464. The first mask layer 462 may be a pad oxide layer made of a silicon oxide, which can be formed by a thermal oxidation. The second mask layer 464 may be made of a silicon nitride (SiN), which is formed by chemical vapor deposition (CVD), including low pressure CVD (LPCVD) and plasma enhanced CVD (PECVD), plasma enhanced atomic layer deposition (PEALD), atomic layer deposition (ALD), or other suitable process.

Figure 16:
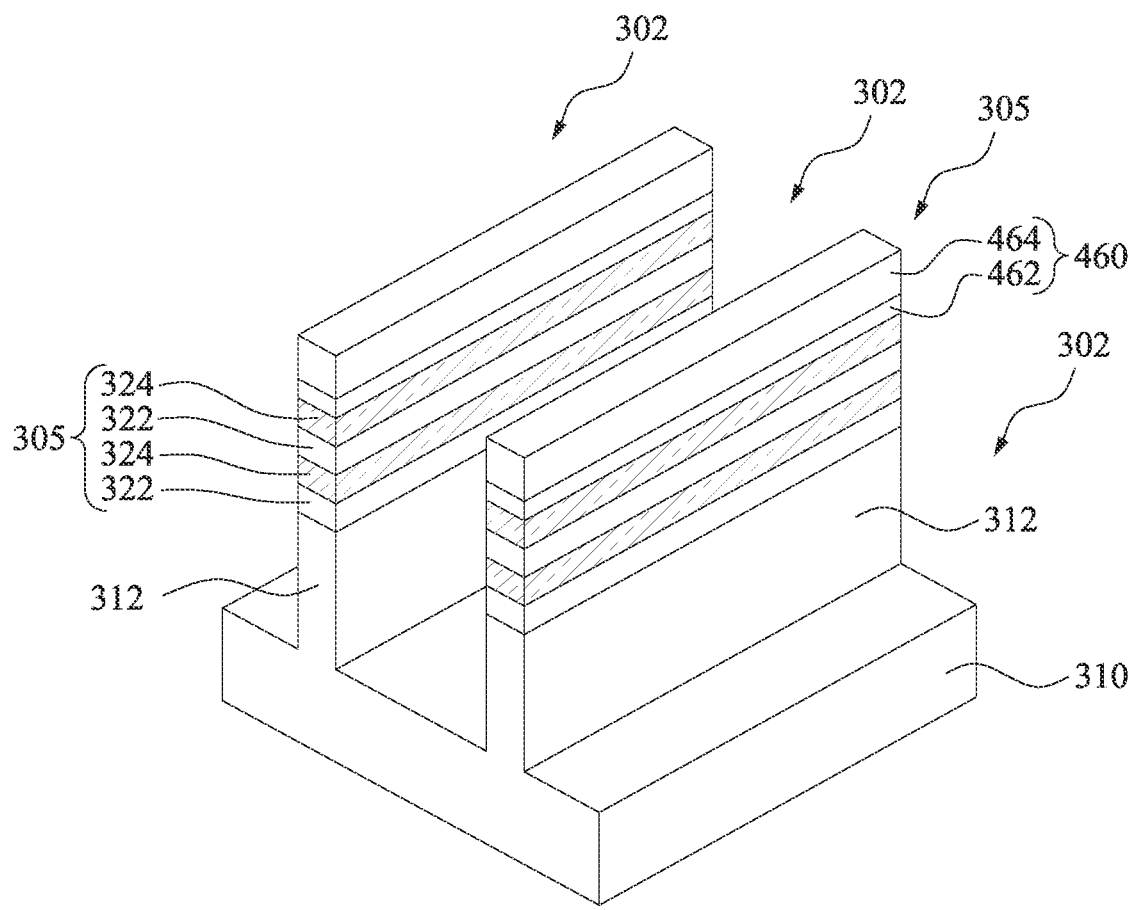

Reference is made to FIG. 16. The stacked structure 320 (see FIG. 15) is patterned by using the patterned mask layer 460 as an etch mask, such that the stacked structure 320 is patterned into fin structures 305 and trenches 302 extending in the X direction. In FIG. 16, two fin structures 305 are arranged in the Y direction. But the number of the fin structures is not limited to, and may be as small as one and three or more. In some embodiments, one or more dummy fin structures are formed on both sides of the fin structures 305 to improve pattern fidelity in the patterning operations.

The trenches 302 extend into the substrate 310 and have lengthwise directions substantially parallel to each other. The trenches 302 form base portions 312 in the substrate 310, where the base portions 312 protrude from the substrate 310, and the fin structures 305 are respectively formed above the base portions 312 of the substrate 310. The remaining portions of the stacked structure 320 are accordingly referred to as the fin structures 305 alternatively.

Figure 17:
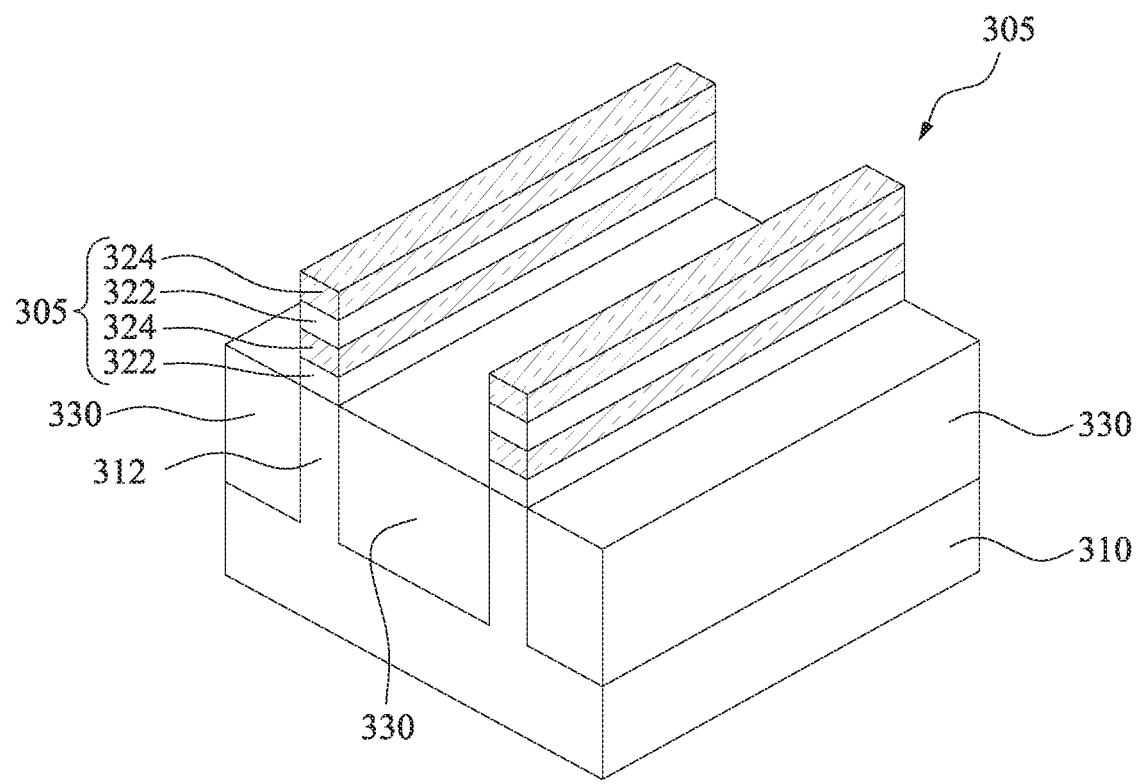

Reference is made to FIG. 17. After the fin structures 305 are formed, isolation structures 330 are formed above the structure in FIG. 16 so that top portions of the fin structures 305 are exposed. Materials, configurations, dimensions, processes and/or operations regarding the isolation structures 330 are similar to or the same as the isolation structures 120 of FIG. 2.

Figure 18:
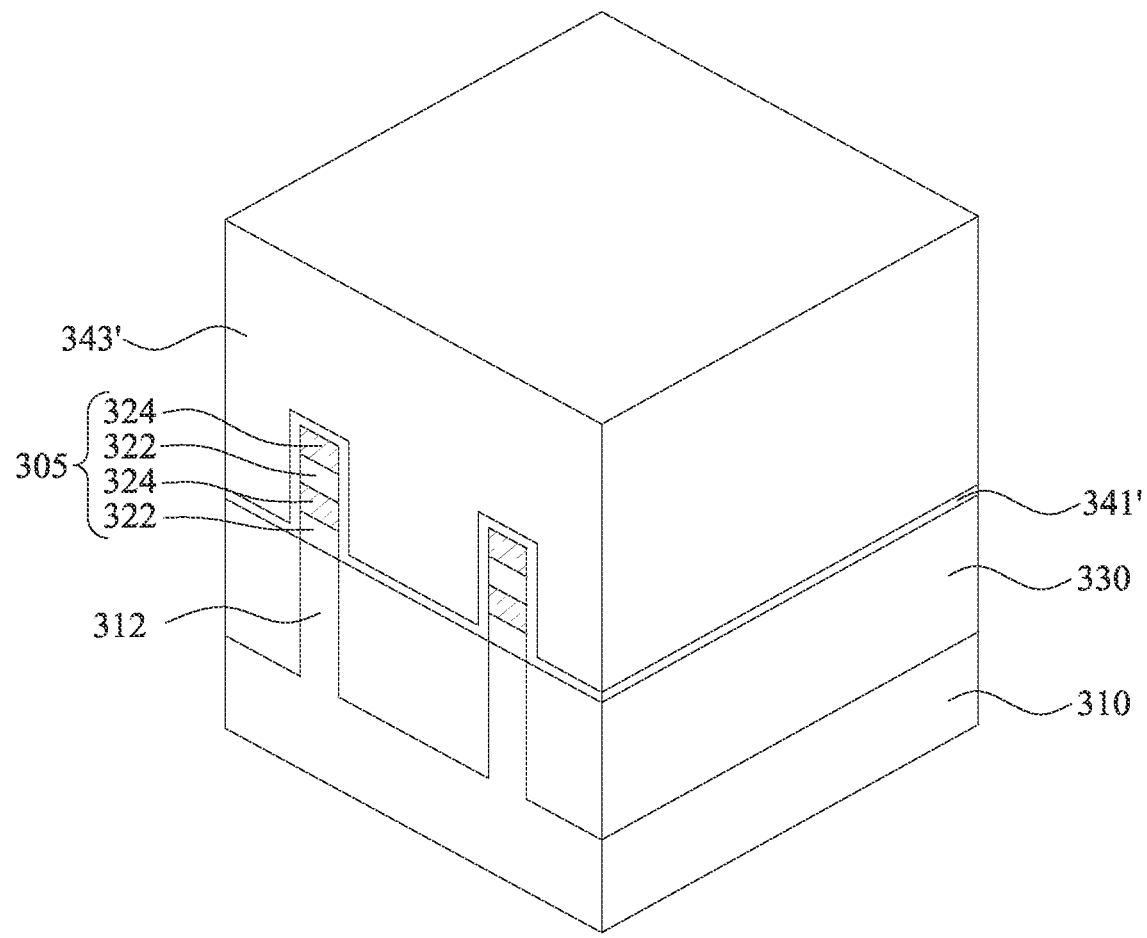

Reference is made to FIG. 18. After the isolation structures 330 are formed, a dummy dielectric layer 341' and a dummy gate layer 343' are formed above the structure in FIG. 17. Materials, configurations, dimensions, processes and/or operations regarding the dummy dielectric layer 341' and the dummy gate layer 343' are similar to or the same as the dummy dielectric layer 131' and the dummy gate layer 133' of FIG. 3, respectively.

Figure 19A:
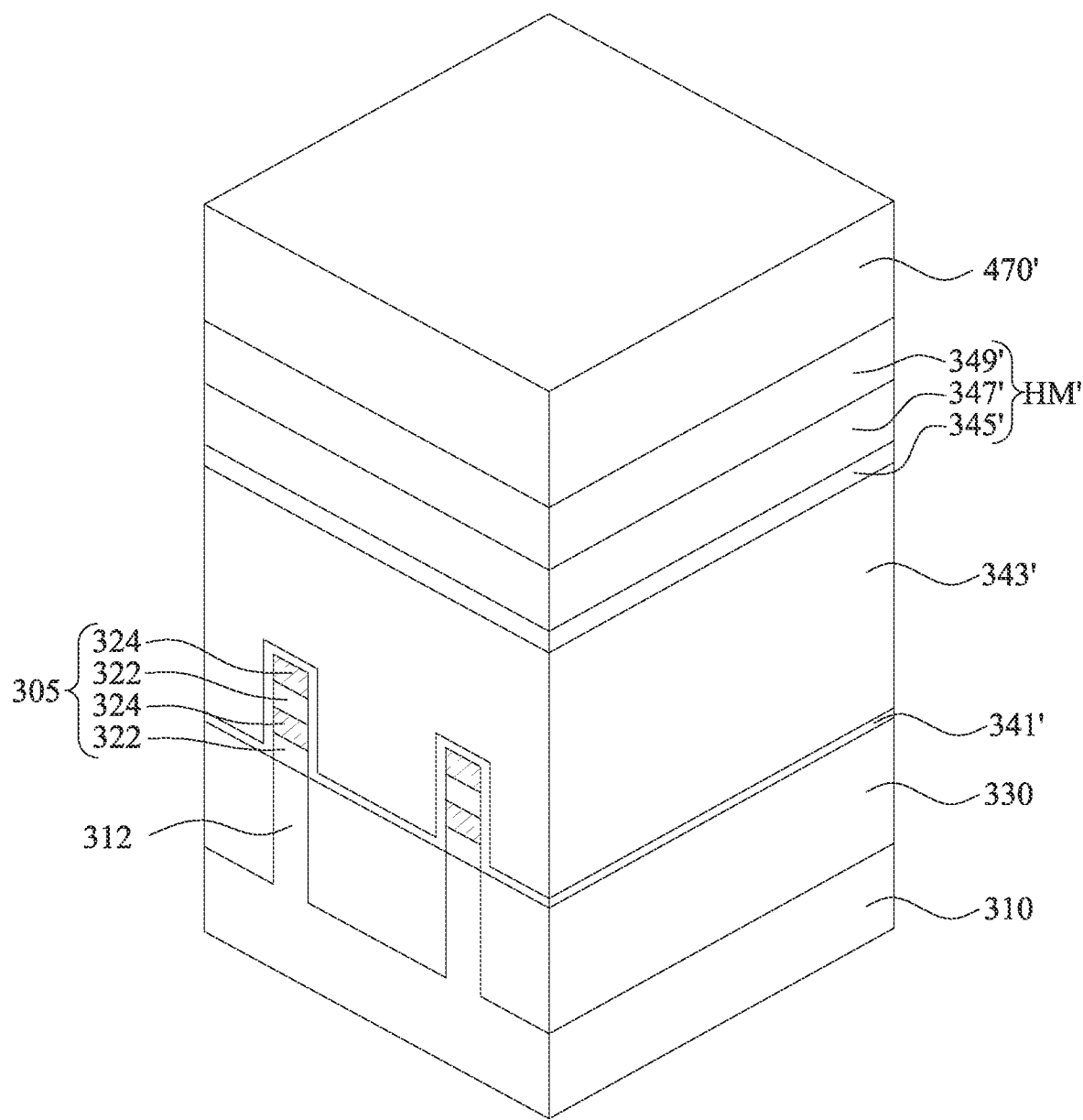
Figure 19B:
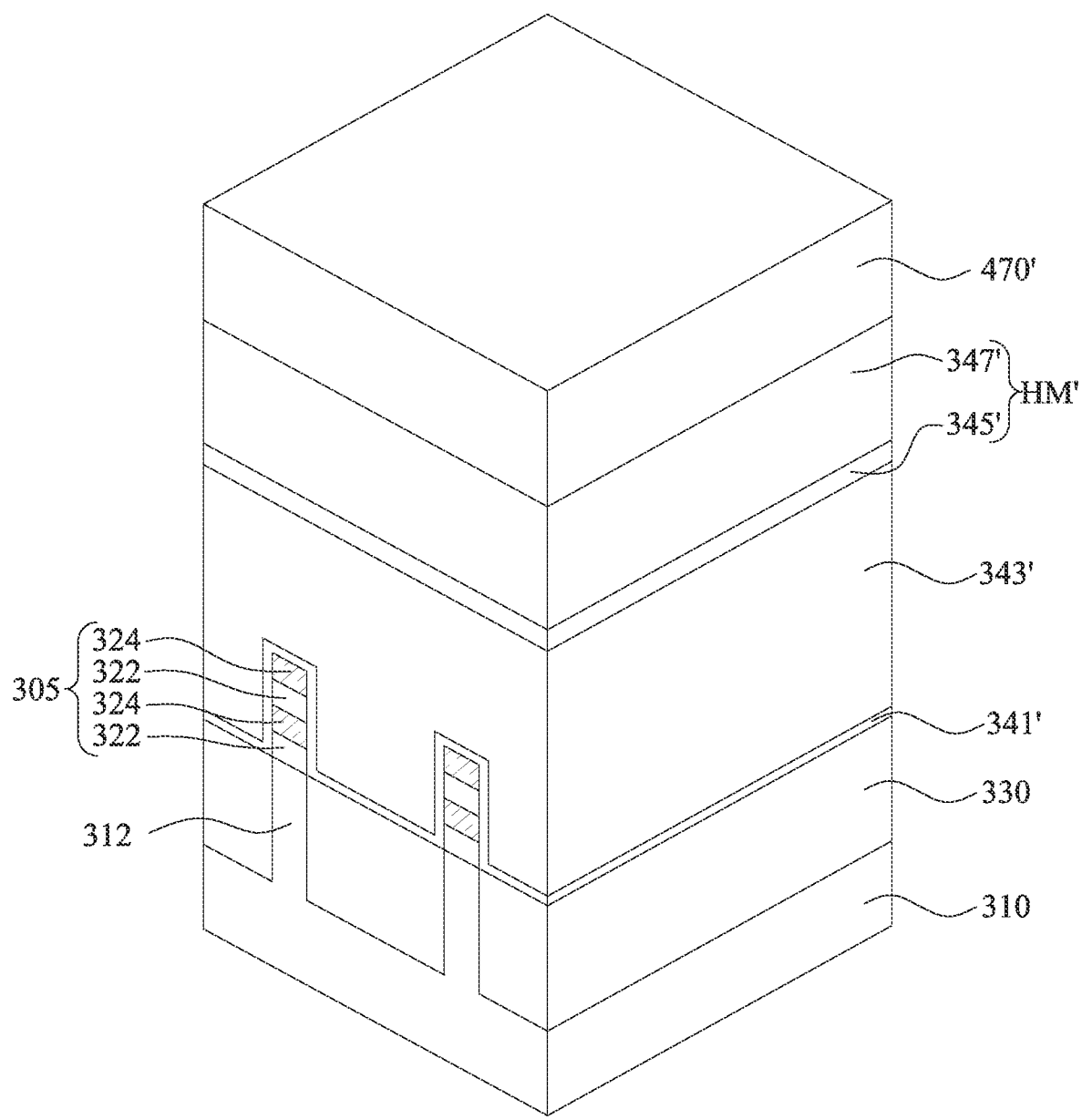

Reference is made to FIGS. 19A and 19B. A hard mask stack HM' is deposited over the dummy gate layer 343'. The hard mask stack HM' include single or multiple dielectric layers and/or metal layers. For example, the hard mask stack HM' includes three sub-layers of hard masks as shown in FIG. 19A or two sub-layers of hard masks as shown in FIG. 19B. It is noted that in some other embodiments, the hard mask stack HM includes more than three sub-layers of hard masks. In FIGS. 19A and 19B, the hard mask stack HM' includes a first hard mask 345' and a second hard mask 347' over the first hard mask 345'. Further, in FIG. 19A, the hard mask stack HM' further includes a third hard mask 349' over the second hard mask 347'. Materials, configurations, dimensions, processes and/or operations regarding the first hard mask 345', the second hard mask 347', and the third hard mask 349' are similar to or the same as the first hard mask 135', the second hard mask 137', and the third hard mask 139' of FIGS. 4A-4B, respectively.

After the formation of the hard mask stack HM', a photoresist bottom layer 470' of a photoresist is formed over the hard mask stack HM'. Materials, configurations, dimensions, processes and/or operations regarding the photoresist bottom layer 470' are similar to or the same as the photoresist bottom layer 220' of FIGS. 4A-4B.

Figure 20A:
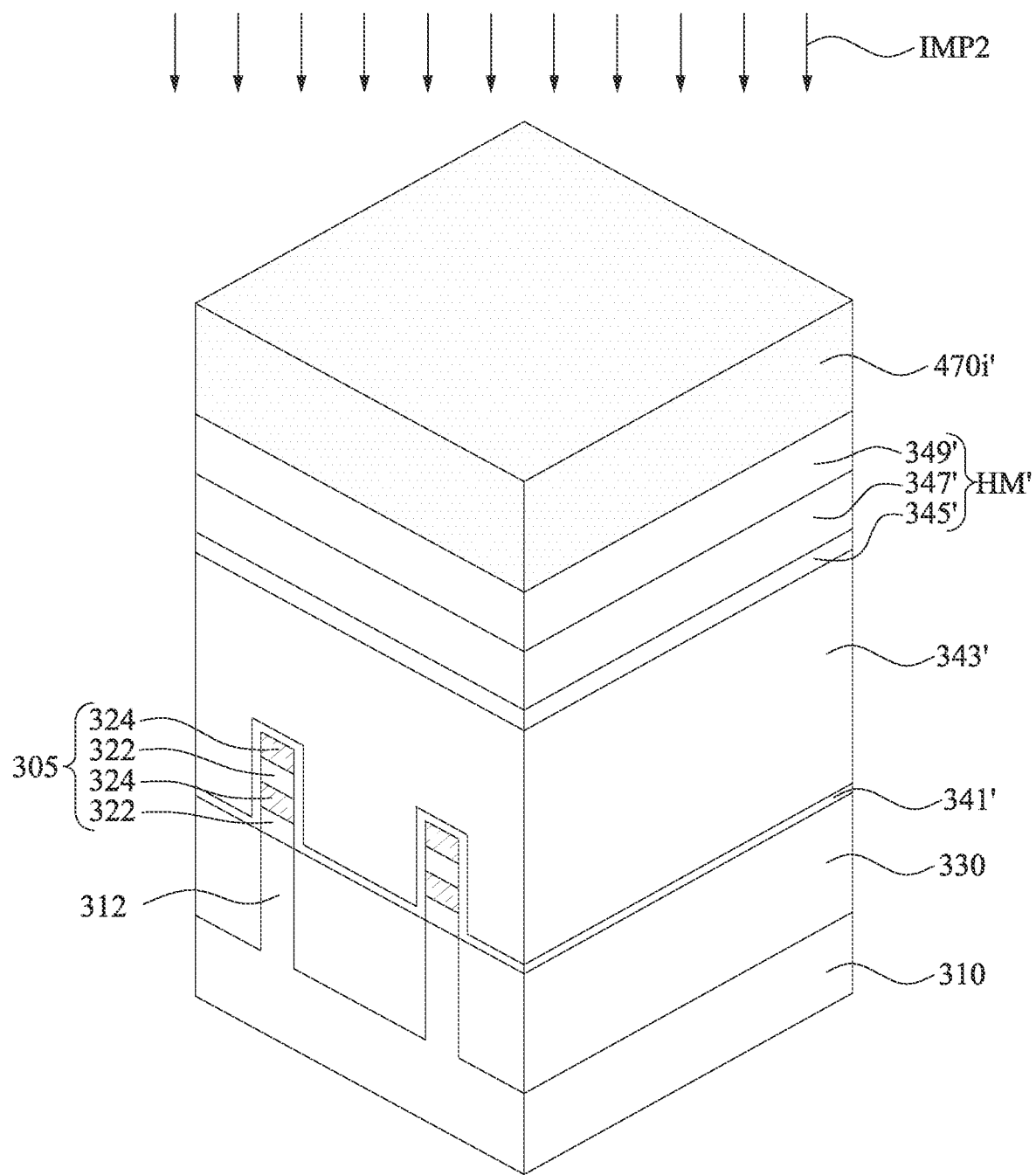
Figure 20B:
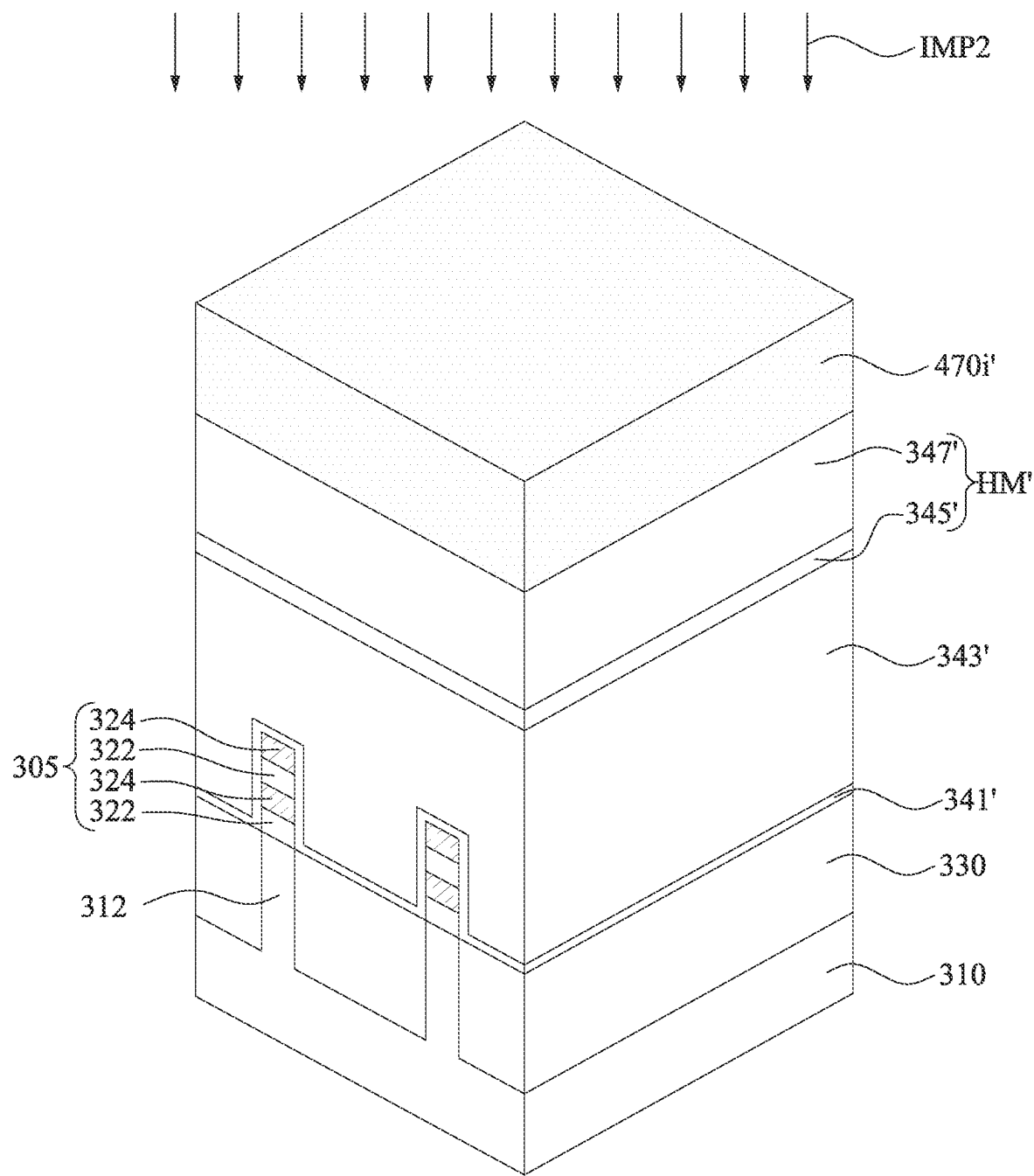
Figure 20B:
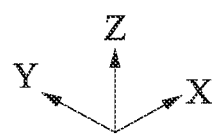

Reference is made to FIGS. 20A and 20B. An implantation process IMP2 is performed to dope one or more impurities (e.g., dopants) into the photoresist bottom layer 470' to form an implanted bottom layer 470i'. Processes and/or operations regarding the implantation process IMP2 are similar to or the same as the implantation process IMP1 of FIGS. 5A-5B.

Figure 21A:
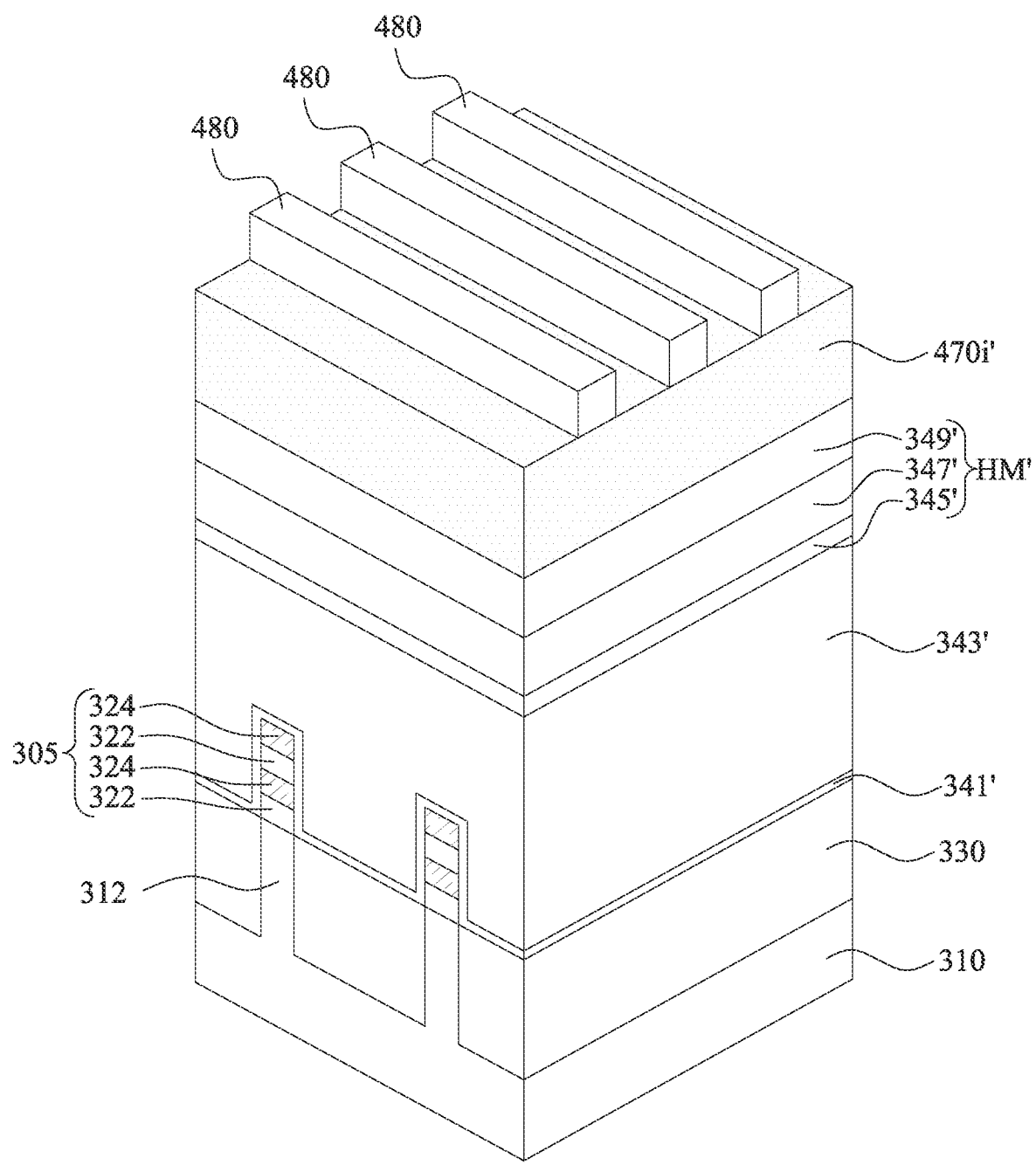
Figure 21B:
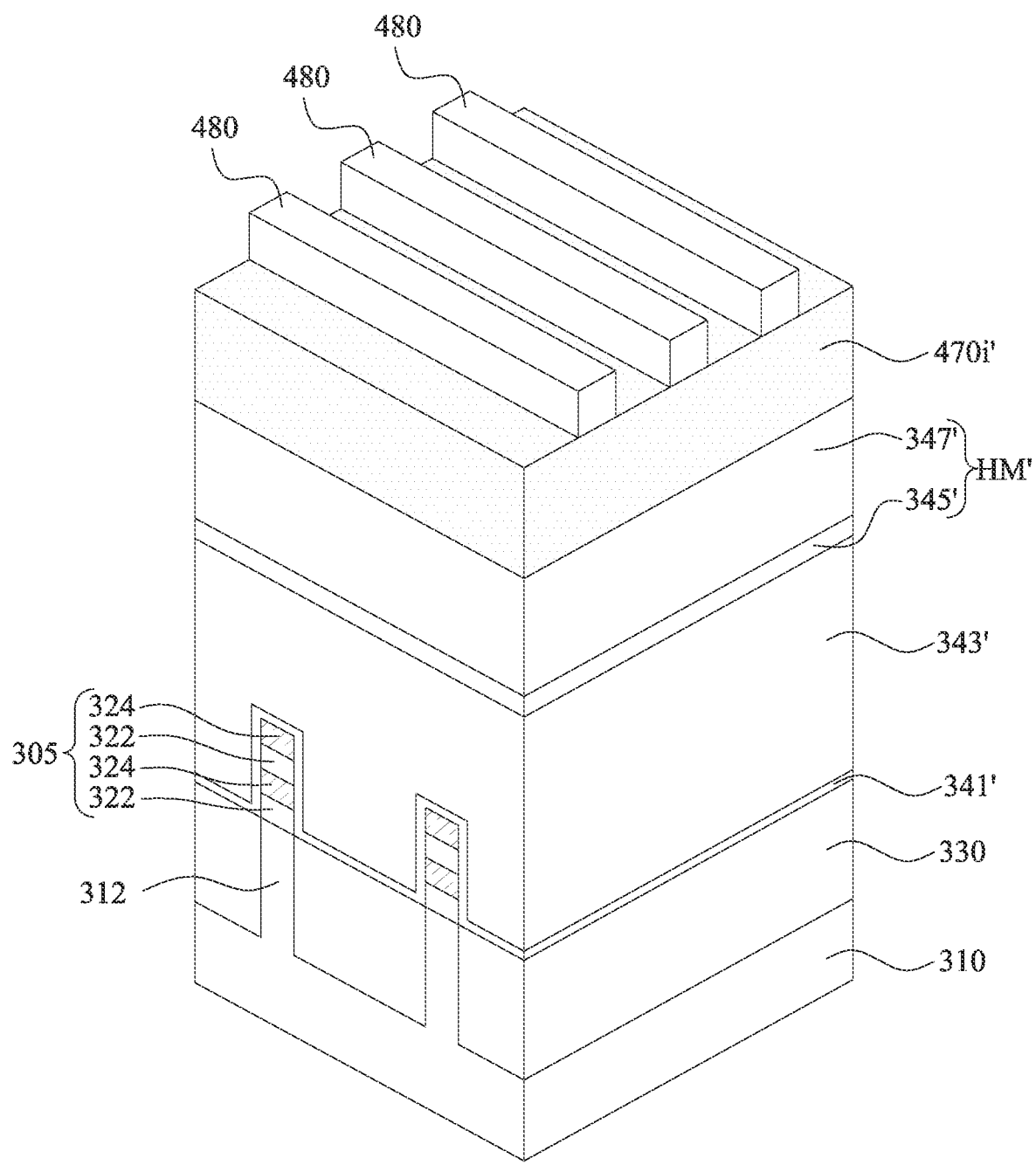

Reference is made to FIGS. 21A and 21B. A patterned photoresist top layer 480 is formed over the implanted bottom layer 470i'. Materials, configurations, dimensions, processes and/or operations regarding the patterned photoresist top layer 480 are similar to or the same as the patterned photoresist top layer 230 of FIGS. 6A-6B.

Figure 22A:
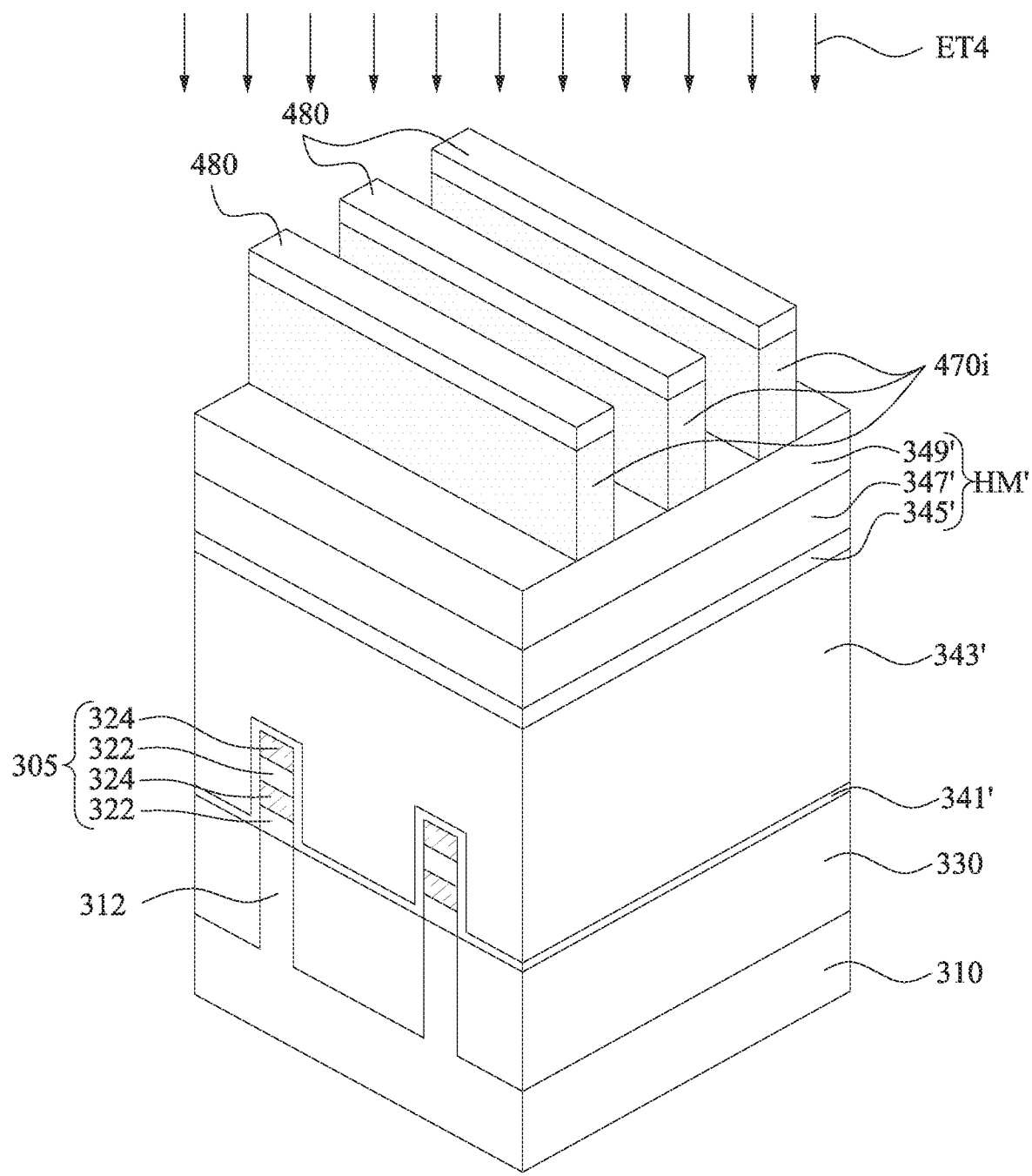
Figure 22B:
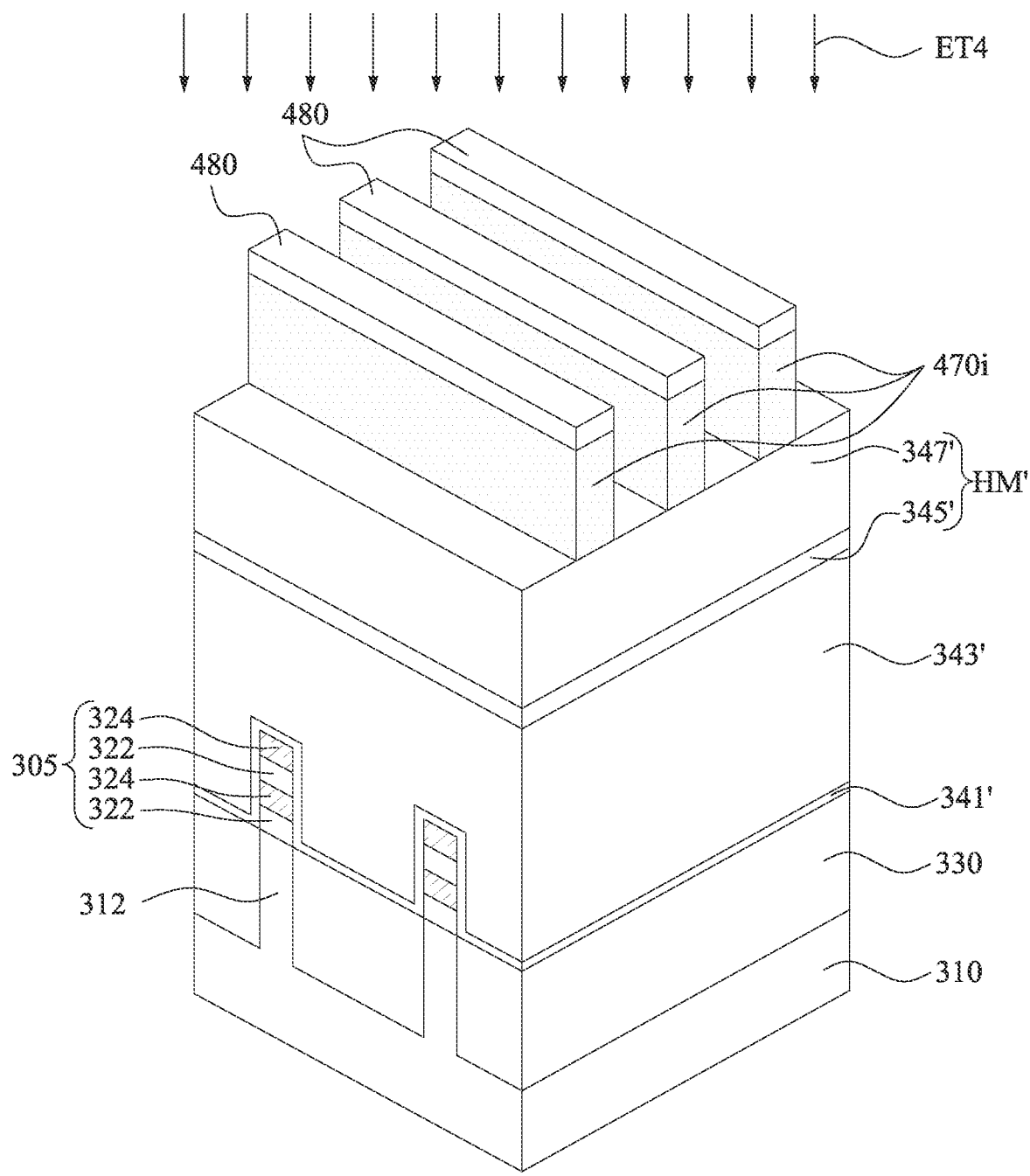

Reference is made to FIGS. 22A and 22B. A first etching process ET4 is performed to pattern the implanted bottom layer 470i' by using the patterned photoresist layers 480 as etching masks. Processes and/or operations regarding the first etching process ET4 are similar to or the same as the first etching process ET1 of FIGS. 7A-7B.

Reference is made to FIGS. 23A and 23B. The patterned photoresist layers 480 are removed, by ashing or etching processes. One or more second etching process(es) ET5 is performed to pattern the hard mask stack HM' by using the patterned implantation layer 480i as etching masks. The patterned hard mask stack is referred to as hard mask stacks HM each includes a first hard mask 345, a second hard mask 347 over the first hard mask 345(, and a third hard mask 349 over the second hard mask 347). Processes and/or operations regarding the second etching process ET5 are similar to or the same as the second etching process ET2 of FIGS. 8A-8B.

Figure 24:
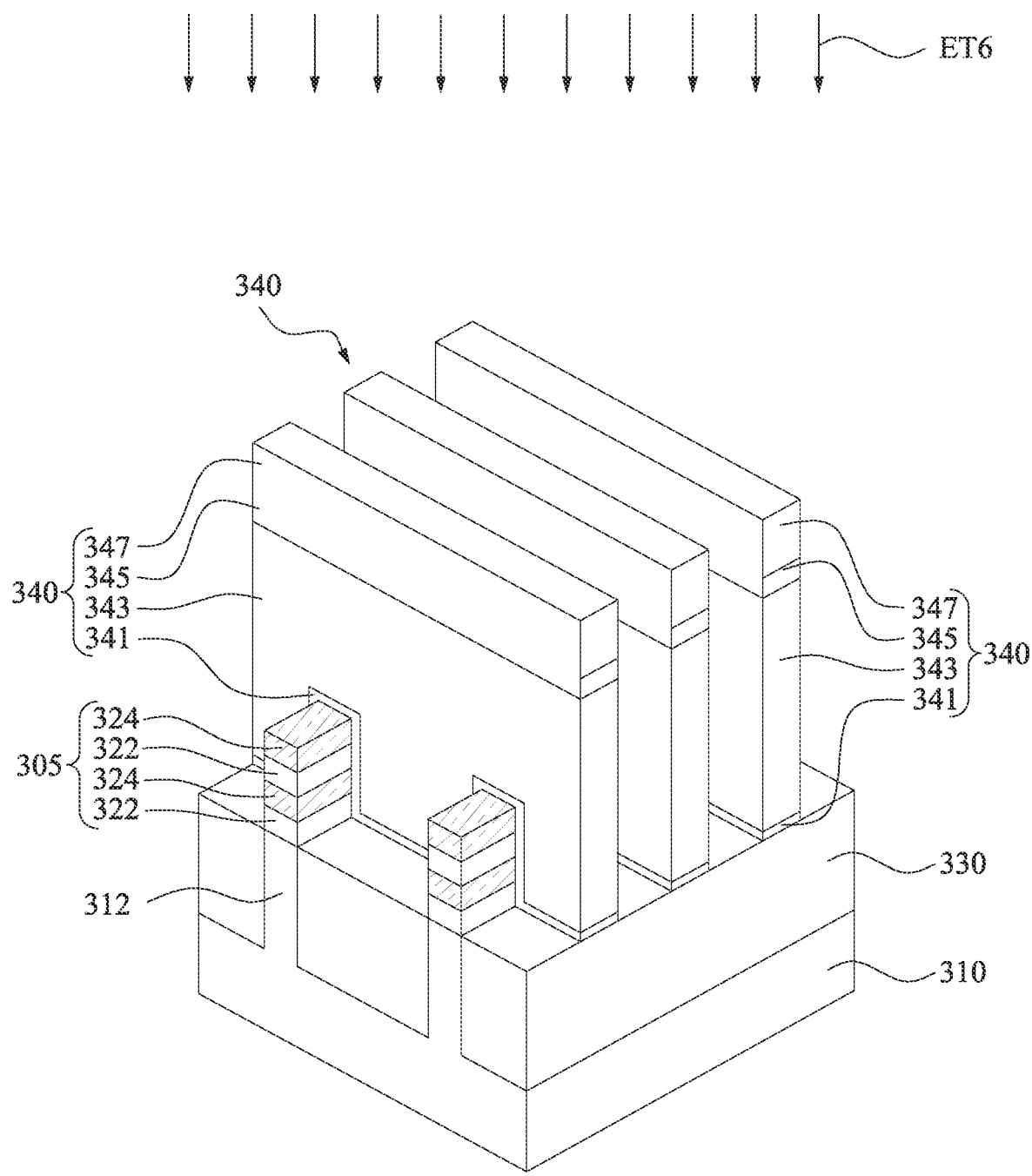

Reference is made to FIG. 24. The remaining implanted bottom layers 480i' are removed by performing an etching process. A third etching process ET6 is performed to pattern the dummy gate layer 343' and the dummy dielectric layer 341' by using the patterned hard mask stacks HM as etching masks. Processes and/or operations regarding the third etching process ET6 are similar to or the same as the second etching process ET2 of FIG. 9.

After the preformation of the third etching process ET3, dummy gate structures 340 are formed over the substrate 110. Each of the dummy gate structures 340 includes the dummy dielectric layer 341, the dummy gate electrode layer 343, and the hard mask stack including, for example but not limited to, the first hard mask 345 and the second hard mask 347.

Figure 25:
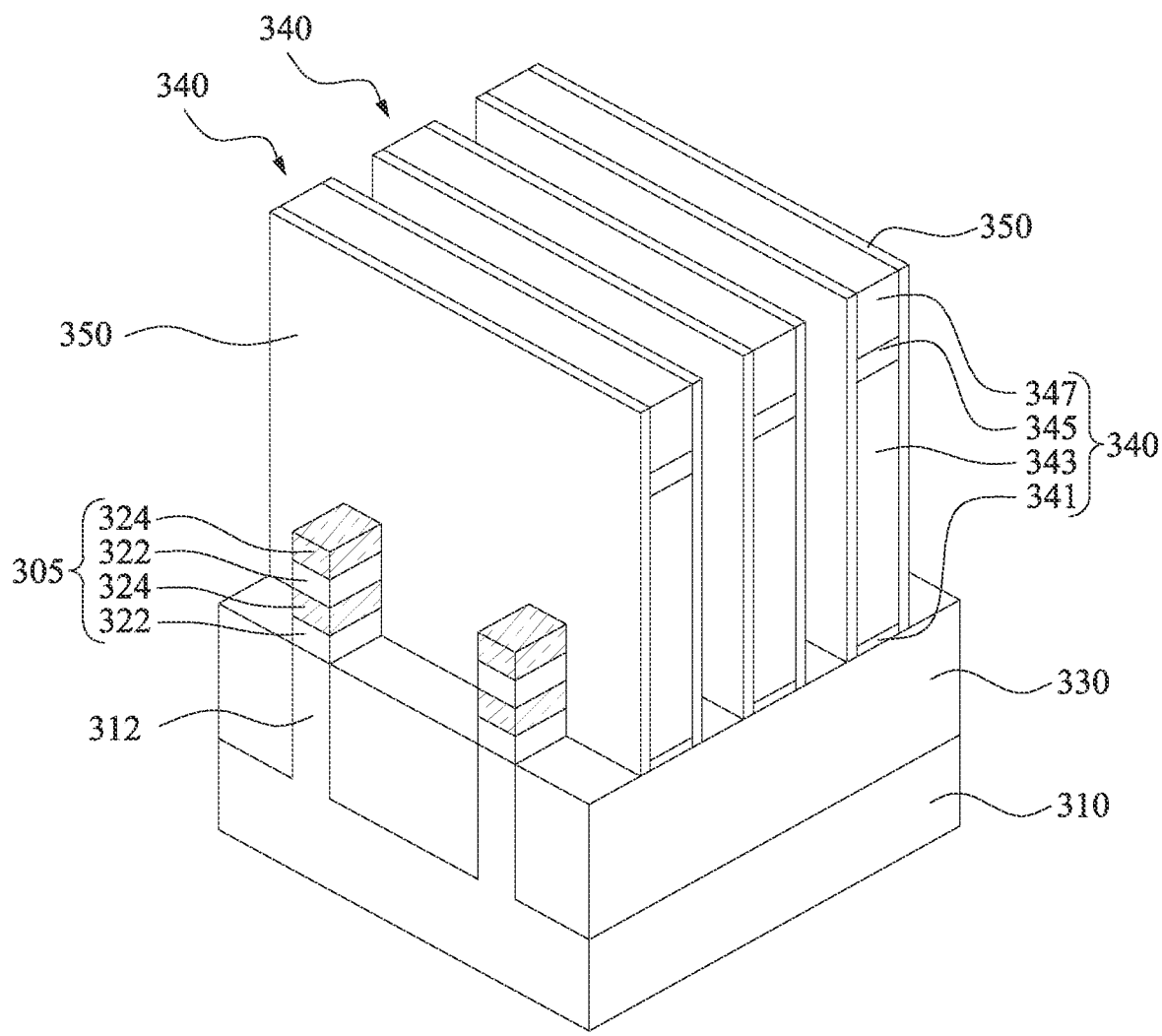

Reference is made to FIG. 25. After formation of the dummy gate structures 340 is completed, spacer structures 350 are formed on sidewalls of the dummy gate structures 340. Materials, configurations, dimensions, processes and/or operations regarding the spacer structures 350 are similar to or the same as the spacer structure 140 of FIG. 10.

Figure 26:
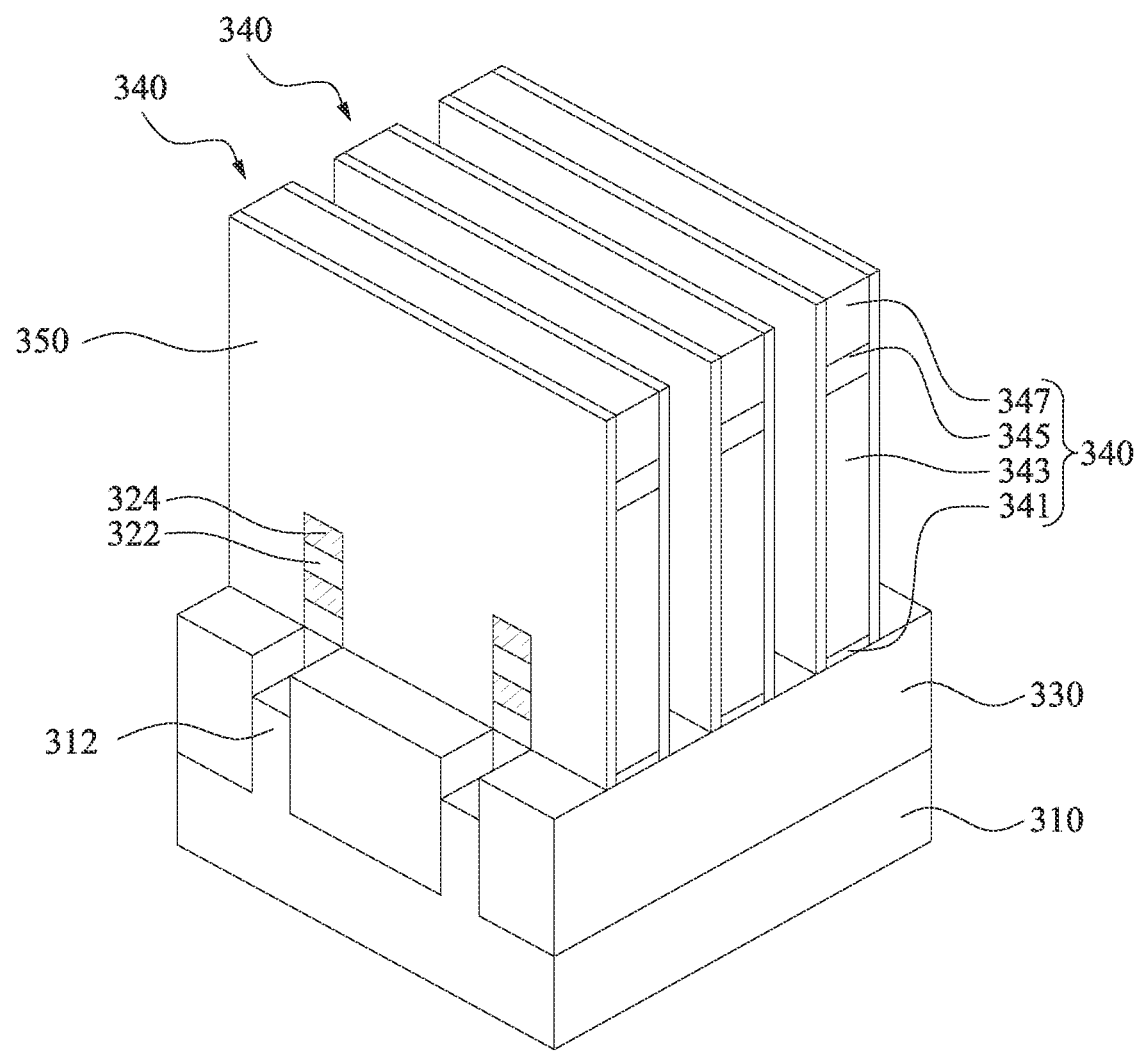

Reference is made to FIG. 26. After the formation of the spacer structures 350 is completed, the exposed portions of the fin structures 305 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICP) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch. During the SSD etching process, portions of the base portions 312 are removed as well.

Figure 27:
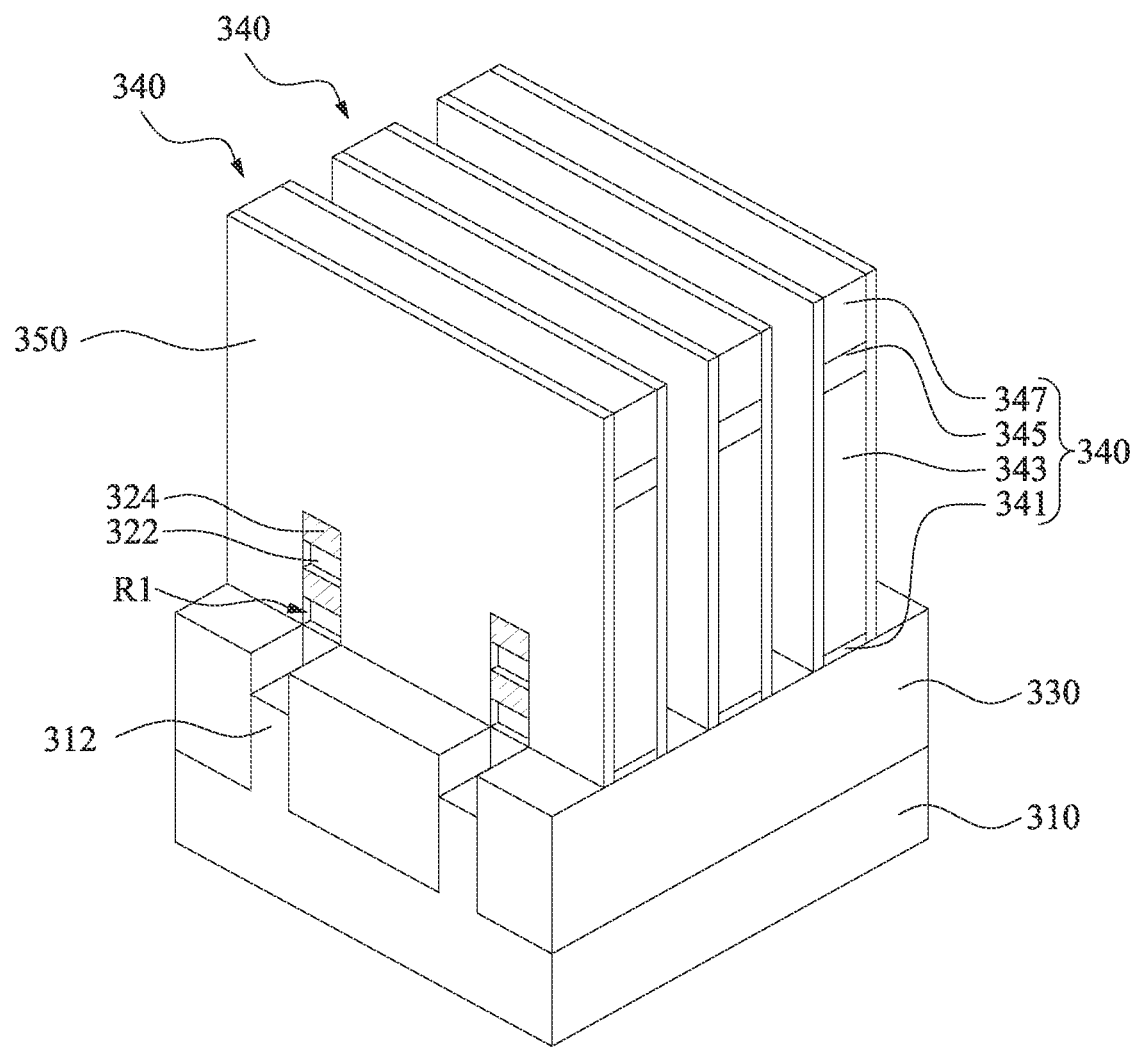

Reference is made to FIG. 27. Subsequently, the first semiconductor layers 322 are horizontally recessed (etched) to for recesses R1 so that the second semiconductor layers 324 laterally extend past opposite end surfaces of the first semiconductor layers 322. In some embodiments, end surfaces of the first semiconductor layers 322 may be substantially vertically aligned with the sidewalls of the spacer structures 350.

Figure 28:
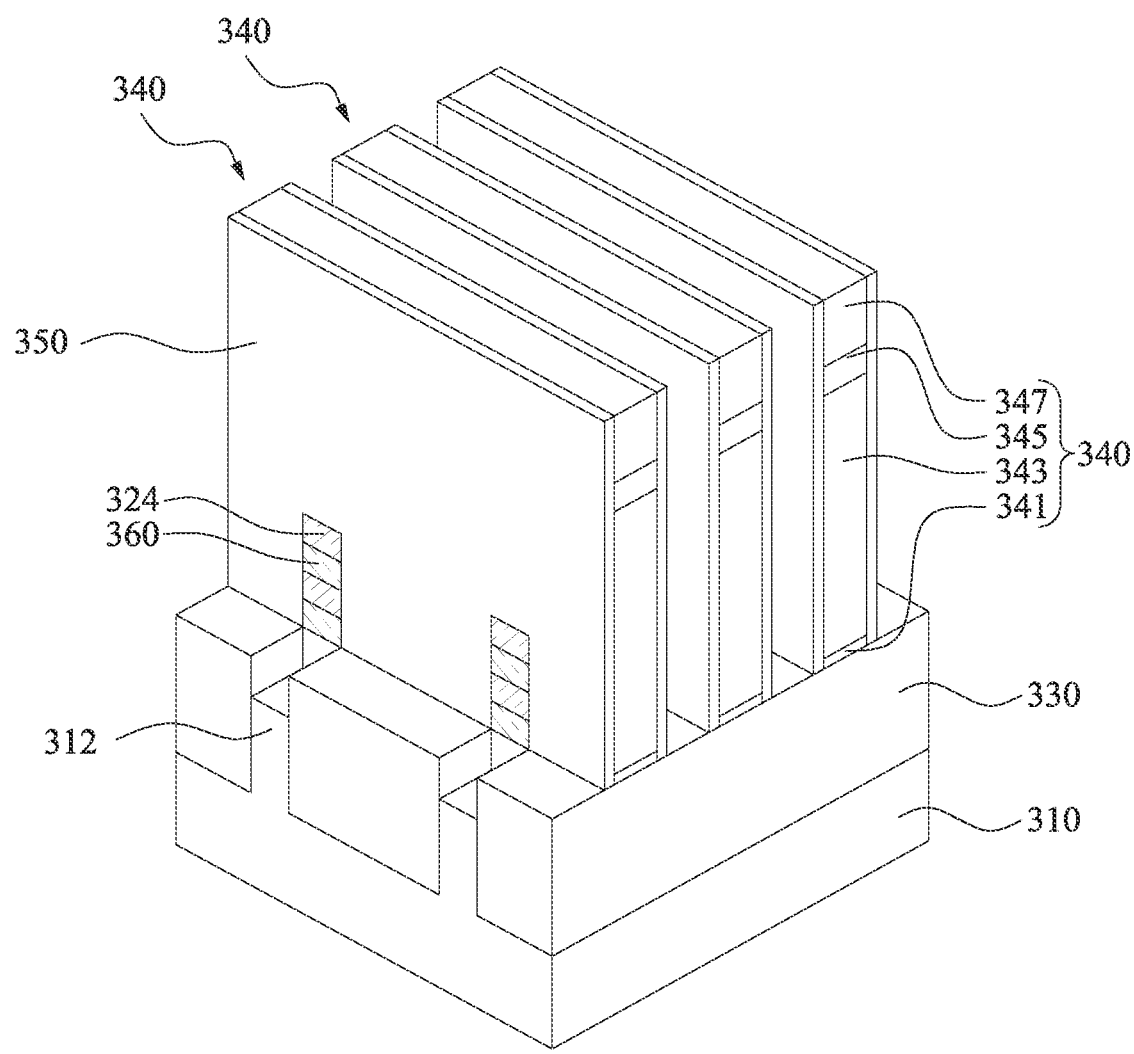

Reference is made to FIG. 28. Inner spacers 360 are respectively formed in the recesses R1 (i.e., on sidewalls of the first semiconductor layers 322) (see FIG. 27). For example, a dielectric material layer is formed over the structure of FIG. 27, and one or more etching operations are performed to form the inner spacers 360. In some embodiments, the inner spacers 360 includes a silicon nitride-based material, such as SiN, SiON, SiOCN or SiCN and combinations thereof and is different from the material of the spacer structures 350. In some embodiments, the inner spacers 360 are silicon nitride. The inner spacers 360 may fully fill the recesses R1 as shown in FIG. 28. The dielectric material layer can be formed using CVD, including PECVD, PEALD, ALD, or other suitable processes. The etching operations include one or more wet and/or dry etching operations. In some embodiments, the etching is an isotropic etching in some embodiments.

Figure 29:
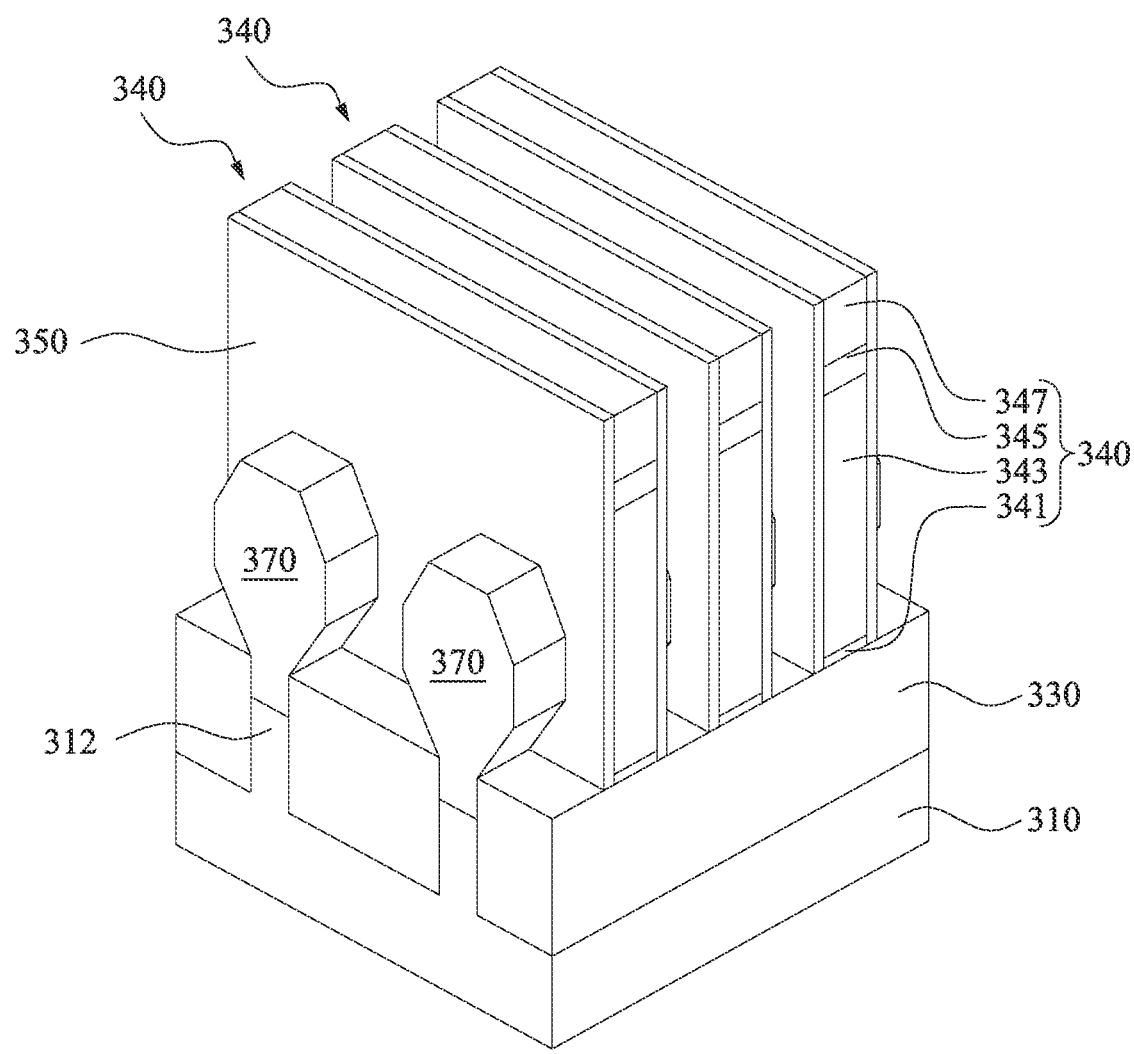
Figure 29:
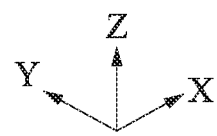

Reference is made to FIG. 29. Source/drain epitaxial structures 370 are formed on source/drain regions of the base portions 312 that are not covered by the dummy gate structures 340 and the spacer structures 350. Materials, configurations, dimensions, processes and/or operations regarding the source/drain epitaxial structures 370 are similar to or the same as the source/drain epitaxial structures 150 of FIG. 11.

Figure 30:
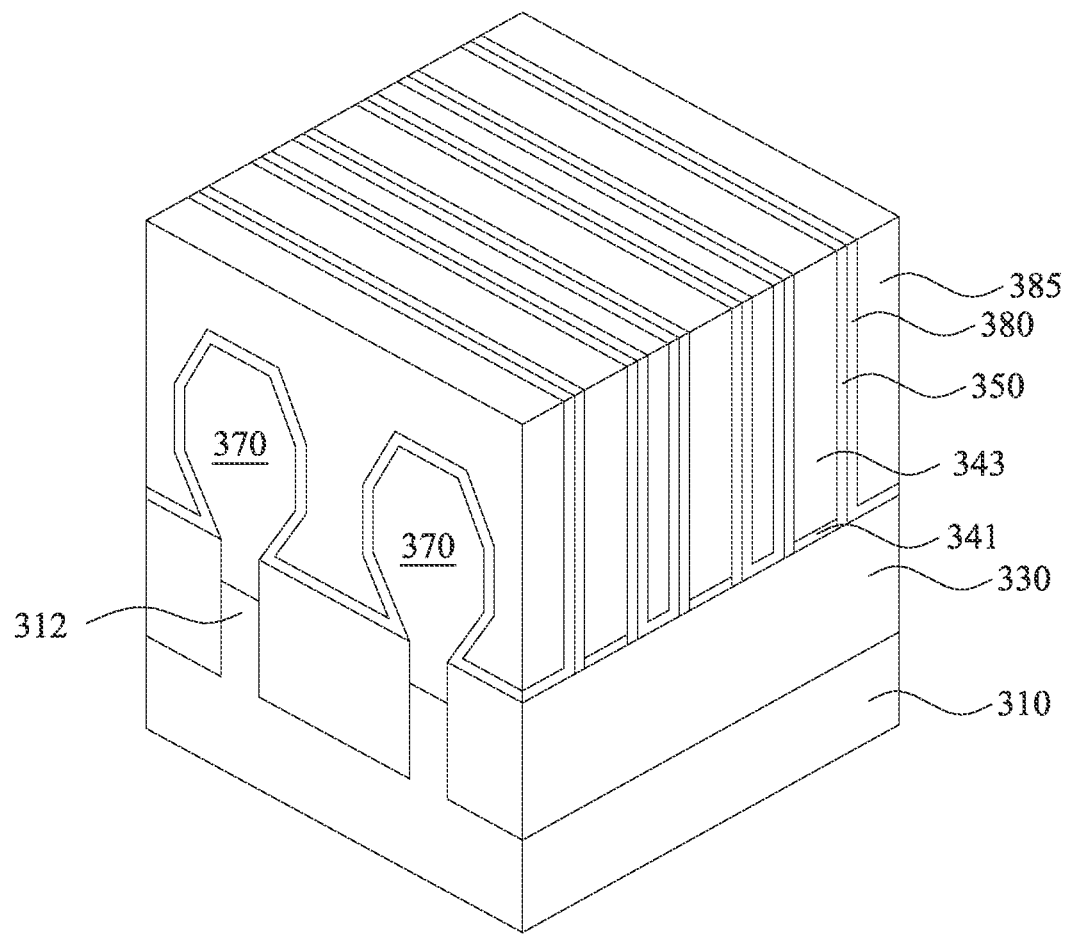
Figure 30:
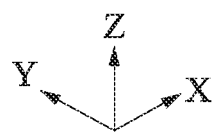

Reference is made to FIG. 30. An interlayer dielectric (ILD) layer 385 is formed on the substrate 310. In some embodiments, a contact etch stop layer (CESL) 380 is also formed prior to forming the ILD layer 385. Materials, configurations, dimensions, processes and/or operations regarding the ILD layer 385 are similar to or the same as the ILD layer 165 of FIG. 12, and materials, configurations, dimensions, processes and/or operations regarding the CESL 380 are similar to or the same as the CESL 160 of FIG. 12. After forming the ILD layer 385, a planarization process may be performed to remove excessive materials of the ILD layer 385.

Figure 31:
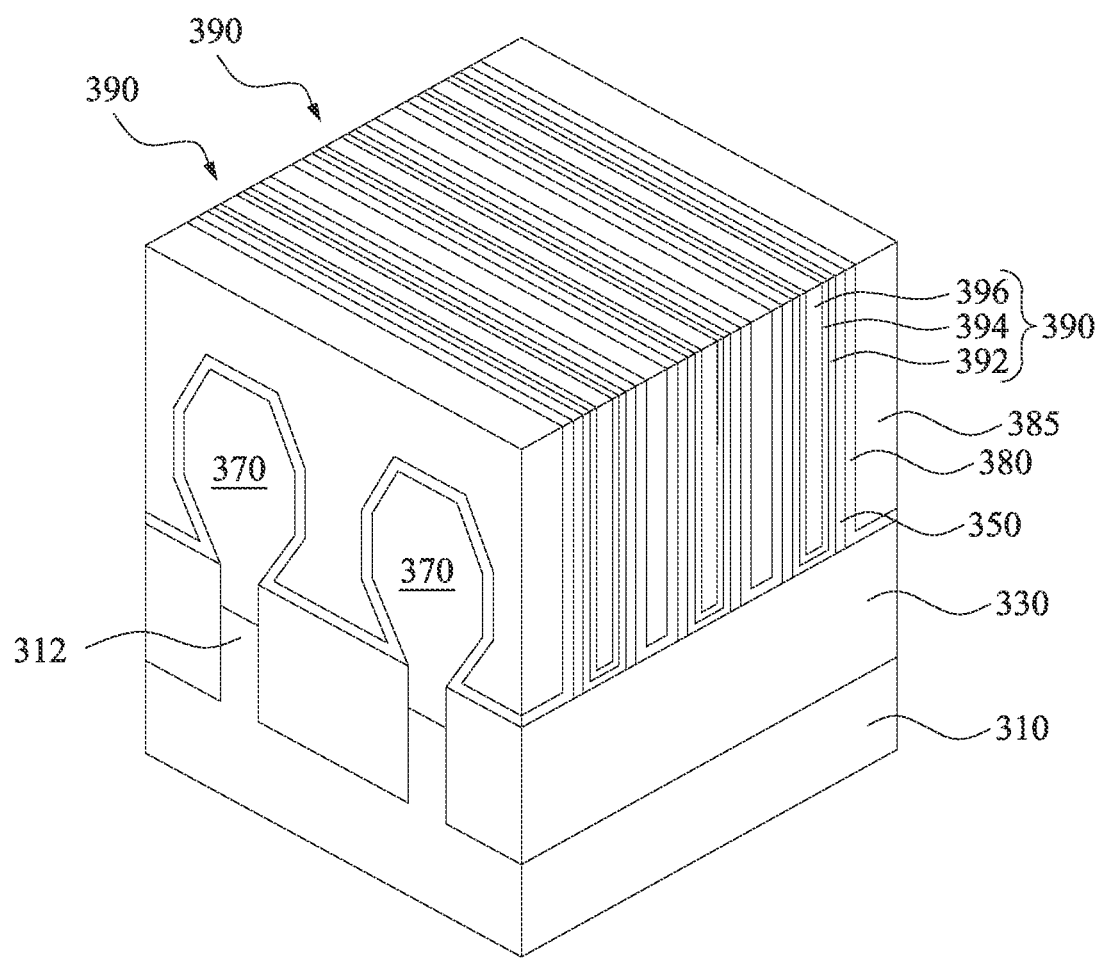

Reference is made to FIG. 31. The dummy gate electrode layers 343, the dummy gate dielectric layers 341 (see FIG. 30), and the first semiconductor layers 322 (see FIG. 27) are removed, resulting in gate trenches between corresponding spacer structures 350. Thereafter, gate structures 390 including gate dielectric layers 392 and gate electrodes (including work function metal layers 394 and fill metals 396) are formed in the gate trenches. The gate structures 390 encircles (wraps) the second semiconductor layers 324, in which the second semiconductor layers 324 are referred to as channels of the semiconductor device. Stated differently, the second semiconductor layers 324 are surrounded by or embedded in the gate structures 390. Materials, configurations, dimensions, processes and/or operations regarding the gate structures 390 are similar to or the same as the gate structures 170 of FIG. 13.

Figure 32:
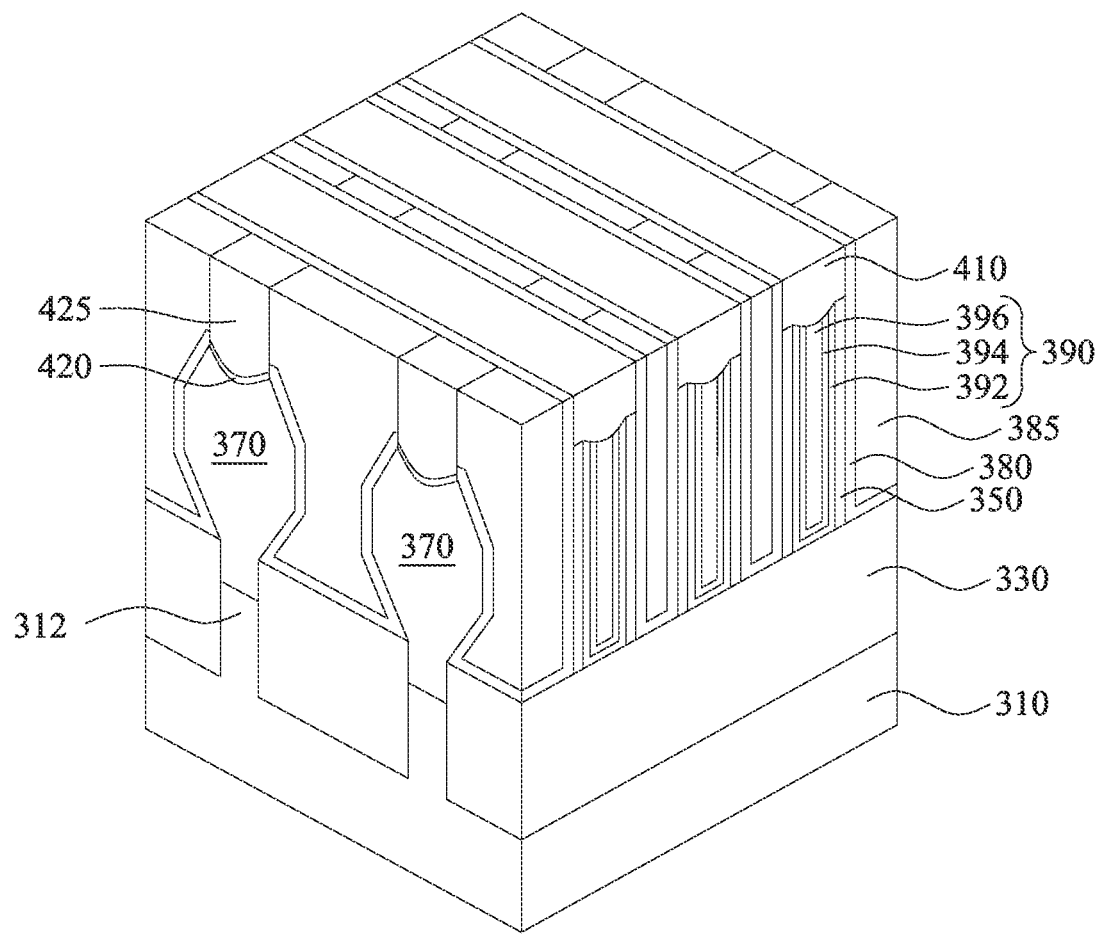
Figure 32:
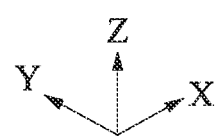

Reference is made to FIG. 32. The structure of FIG. 31 undergoes the processes similar to the processes shown in FIG. 14. That is, an etching back process is optionally performed to etch back the replacement gate structures 390 and the spacer structures 350, and dielectric caps 410 are formed over the etched gate structures 390. Materials, configurations, dimensions, processes and/or operations regarding the dielectric caps 410 are similar to or the same as the dielectric caps 180 of FIG. 14.

After the formation of the dielectric caps 410 is completed, source/drain contacts 425 are formed extending through the ILD layer 385. In some embodiments, metal alloy layers 420 are respectively formed above the source/drain epitaxial structures 370 prior to forming the source/drain contacts 425. Materials, configurations, dimensions, processes and/or operations regarding the source/drain contacts 425 are similar to or the same as the source/drain contacts 195 of FIG. 14. Materials, configurations, dimensions, processes and/or operations regarding the metal alloy layers 420 are similar to or the same as the metal alloy layers 190 of FIG. 14.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the implanted bottom layer can lower the aspect ratio of the patterned implanted bottom layer, and thus neutralize the stress thereof. Further, the implanted bottom layer has high etching resistance and can protect the hard mask stack during etching processes. The neutralized stress improves the distortion of the dummy gates, resulting in small line width variation of the dummy gates. Moreover, the short issue between the gate structures and the source/drain contacts can be improved.

According to some embodiments, a method includes forming a fin structure over a substrate; depositing a dummy gate layer over the substrate and the fin structure; depositing a hard mask stack over the dummy gate layer; depositing a photoresist bottom layer over the hard mask stack, wherein the photoresist bottom layer has a first stress; performing an implantation process to the photoresist bottom layer to form an implanted bottom layer with a second stress closer to 0 than the first stress; patterning the implanted bottom layer; patterning the hard mask stack and the dummy gate layer by using the patterned implanted bottom layer as an etch mask to form a dummy gate structure over the fin structure; and replacing the dummy gate structure with a metal gate structure.

According to some embodiments, a method includes forming a semiconductor fin over a substrate; depositing a dummy gate layer over the semiconductor fin; depositing a hard mask stack over the dummy gate layer; depositing an amorphous carbon layer over the hard mask stack; implanting carbon atoms into the amorphous carbon layer to increase an amount of sp3 carbon atoms in the amorphous carbon layer; after implanting the carbon atoms, patterning the amorphous carbon layer; patterning the hard mask stack by using the patterned amorphous carbon layer as an etch mask; patterning the dummy gate layer by using the patterned hard mask stack as an etch mask; and replacing the patterned dummy gate layer with a metal gate structure.

According to some embodiments, a method includes forming a fin structure over a substrate; depositing a dummy gate layer over the fin structure and the substrate; depositing a hard mask stack over the dummy gate layer; forming a patterned photoresist bottom layer over the hard mask stack, wherein the patterned photoresist bottom layer has a pattern with an aspect ratio in a range from about 1 to about 4; patterning the hard mask stack by using the patterned photoresist bottom layer, wherein a portion of the patterned photoresist bottom layer remains on the patterned hard mask stack; etching the dummy gate layer by using the patterned hard mask stack as an etch mask to form a dummy gate structure; and replacing the dummy gate structure with a metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin structure over a substrate;
   depositing a dummy gate layer over the substrate and the fin structure;
   depositing a hard mask stack over the dummy gate layer;
   depositing a photoresist bottom layer over the hard mask stack, wherein the photoresist bottom layer has a first stress;
   performing an implantation process to the photoresist bottom layer to form an implanted bottom layer with a second stress closer to 0 than the first stress;
   patterning the implanted bottom layer;
   patterning the hard mask stack and the dummy gate layer by using the patterned implanted bottom layer as an etch mask to form a dummy gate structure over the fin structure; and
   replacing the dummy gate structure with a metal gate structure.

2. The method of claim 1, wherein a thickness of the hard mask stack is greater than a thickness of the photoresist bottom layer.

3. The method of claim 1, wherein a thickness of the photoresist bottom layer is in a range from about 1 nm to about 100 nm.

4. The method of claim 1, wherein dopants implanted in the implanted bottom layer comprises carbon, argon, germanium, xenon, silicon, nitrogen, or combinations thereof.

5. The method of claim 1, wherein the implantation process is performed at a dose of about 1E14 ion/cm$^2$ to about 1E16 ion/cm$^2$.

6. The method of claim 1, wherein a dopant concentration of the implanted bottom layer is a Gaussian distribution in a depth direction, and a peak of the Gaussian distribution of the dopant concentration is at substantially half-thickness of the implanted bottom layer.

7. The method of claim 1, wherein the second stress of the implanted bottom layer is in a range from about −0.5 Gpa to about 0 Gpa.

8. A method comprising:
   forming a semiconductor fin over a substrate;
   depositing a dummy gate layer over the semiconductor fin;
   depositing a hard mask stack over the dummy gate layer;
   depositing an amorphous carbon layer over the hard mask stack;
   implanting carbon atoms into the amorphous carbon layer to increase an amount of sp3 carbon atoms in the amorphous carbon layer;
   after implanting the carbon atoms, patterning the amorphous carbon layer;
   patterning the hard mask stack by using the patterned amorphous carbon layer as an etch mask;
   patterning the dummy gate layer by using the patterned hard mask stack as an etch mask; and
   replacing the patterned dummy gate layer with a metal gate structure.

9. The method of claim 8, wherein a sp3/sp2 ratio in the amorphous carbon layer after implanting the carbon atoms is in a range from about 0.3 to about 1.6.

10. The method of claim 8, wherein a portion of the patterned amorphous carbon layer remains on the patterned hard mask stack after patterning the hard mask stack.

11. The method of claim 8, wherein a thickness of the amorphous carbon layer is in a range from about 1 nm to about 100 nm.

12. The method of claim 8, wherein a thickness of the amorphous carbon layer is less than a thickness of the hard mask stack.

13. The method of claim 8, wherein the hard mask stack comprises multiple dielectric layers.

14. The method of claim 8, wherein the hard mask stack comprises $SiO_2$, SiN, SiON, SiOCN, or combinations thereof.

15. A method comprising:
   forming a fin structure over a substrate;
   depositing a dummy gate layer over the fin structure and the substrate;
   depositing a hard mask stack over the dummy gate layer;
   forming a patterned photoresist bottom layer over the hard mask stack, wherein the patterned photoresist bottom layer has a pattern with an aspect ratio in a range from about 1 to about 4;
   patterning the hard mask stack by using the patterned photoresist bottom layer, wherein a portion of the patterned photoresist bottom layer remains on the patterned hard mask stack;

etching the dummy gate layer by using the patterned hard mask stack as an etch mask to form a dummy gate structure; and replacing the dummy gate structure with a metal gate structure.

16. The method of claim 15, wherein a stress of the patterned photoresist bottom layer is in a range from about −0.5 Gpa to about 0 Gpa.

17. The method of claim 15, wherein a thickness of the patterned photoresist bottom layer is less than a thickness of the hard mask stack.

18. The method of claim 15, wherein the patterned photoresist bottom layer is made of amorphous carbon, $SiO_2$, SiN, SiON, SiOCN, or combinations thereof.

19. The method of claim 15, wherein the patterned photoresist bottom layer comprises carbon dopants, argon dopants, germanium dopants, xenon dopants, silicon dopants, nitrogen dopants, or combinations thereof.

20. The method of claim 15, wherein the patterned photoresist bottom layer comprises sp3 carbon atoms.

* * * * *